(12) United States Patent
Bilodeau et al.

(10) Patent No.: US 10,347,504 B2
(45) Date of Patent: Jul. 9, 2019

(54) USE OF NON-OXIDIZING STRONG ACIDS FOR THE REMOVAL OF ION-IMPLANTED RESIST

(71) Applicant: Entegris, Inc., Billerica, MA (US)

(72) Inventors: Steven Bilodeau, Oxford, CT (US);
Emanuel I. Cooper, Scarsdale, NY (US); Jaeseok Lee, Gyeonggi-do (KR); WonLae Kim, Gyeonggi-do (KR); Jeffrey A. Barnes, Danielsville, PA (US)

(73) Assignee: Entegris, Inc., Billerica, MA (US)

( * ) Notice: Subject to any disclaimer, the term of this patent is extended or adjusted under 35 U.S.C. 154(b) by 0 days.

(21) Appl. No.: 15/892,775

(22) Filed: Feb. 9, 2018

(65) Prior Publication Data

US 2018/0240680 A1    Aug. 23, 2018

Related U.S. Application Data

(63) Continuation of application No. 15/105,833, filed as application No. PCT/US2014/071540 on Dec. 19, 2014, now abandoned.

(60) Provisional application No. 62/046,495, filed on Sep. 5, 2014, provisional application No. 62/045,946, filed on Sep. 4, 2014, provisional application No. 61/919,177, filed on Dec. 20, 2013.

(51) Int. Cl.
| | |
|---|---|
| *H01L 21/311* | (2006.01) |
| *G03F 7/42* | (2006.01) |
| *H01L 21/02* | (2006.01) |
| *H01L 21/027* | (2006.01) |

(52) U.S. Cl.
CPC ........ *H01L 21/31133* (2013.01); *G03F 7/423* (2013.01); *H01L 21/02057* (2013.01); *H01L 21/0273* (2013.01)

(58) Field of Classification Search
USPC .......................................... 438/745; 252/79.2
See application file for complete search history.

(56) References Cited

U.S. PATENT DOCUMENTS

| | | | |
|---|---|---|---|
| 2,651,596 A | 9/1953 | Krause | |
| 4,064,284 A * | 12/1977 | Theron | ................... A23L 7/197 426/482 |
| 4,187,191 A | 2/1980 | Simpson, Jr. | |
| 5,008,515 A | 4/1991 | McCormack | |

(Continued)

FOREIGN PATENT DOCUMENTS

| | | |
|---|---|---|
| CN | 1447754 A | 10/2003 |
| CN | 102839062 A | 12/2012 |

(Continued)

OTHER PUBLICATIONS

Adachi, S. et al., "A new etchant system, K2 CR2 07-H2S04-HCL, for GaAs and InP", Journal of Materials Science, Kluwer Academic Publishers, 1981, pp. 2449-2456.

(Continued)

*Primary Examiner* — Roberts P Culbert
(74) *Attorney, Agent, or Firm* — Entegris, Inc.

(57) ABSTRACT

A method and composition for removing bulk and/or ion-implanted resist material from microelectronic devices have been developed. The compositions effectively remove the ion-implanted resist material while not damaging the silicon-containing or germanium-containing materials.

10 Claims, 13 Drawing Sheets

(56) References Cited

U.S. PATENT DOCUMENTS

| | | |
|---|---|---|
| 5,320,709 A | 6/1994 | Bowden et al. |
| 5,397,398 A * | 3/1995 | Van Vlahakis ......... B08B 9/032 134/22.11 |
| 5,702,075 A | 12/1997 | Lehrman |
| 5,792,274 A | 8/1998 | Tanabe et al. |
| 5,952,157 A | 9/1999 | Kato et al. |
| 5,976,928 A | 11/1999 | Kirlin et al. |
| 5,993,685 A | 11/1999 | Currie et al. |
| 6,194,366 B1 | 2/2001 | Naghshineh et al. |
| 6,211,126 B1 | 4/2001 | Wojtczak et al. |
| 6,224,785 B1 | 5/2001 | Wojtczak et al. |
| 6,280,651 B1 | 8/2001 | Wojtczak et al. |
| 6,306,807 B1 | 10/2001 | Wojtczak et al. |
| 6,322,600 B1 | 11/2001 | Brewer et al. |
| 6,323,168 B1 | 11/2001 | Kloffenstein et al. |
| 6,344,432 B1 | 2/2002 | Wojtczak et al. |
| 6,346,741 B1 | 2/2002 | Van Buskirk et al. |
| 6,395,194 B1 | 5/2002 | Russell et al. |
| 6,409,781 B1 | 6/2002 | Wojtczak et al. |
| 6,492,308 B1 | 12/2002 | Naghshineh et al. |
| 6,527,819 B2 | 3/2003 | Wojtczak et al. |
| 6,566,315 B2 | 5/2003 | Wojtczak et al. |
| 6,627,587 B2 | 9/2003 | Naghshineh et al. |
| 6,723,691 B2 | 4/2004 | Naghshineh et al. |
| 6,735,978 B1 | 5/2004 | Tom et al. |
| 6,755,989 B2 | 6/2004 | Wojtczak et al. |
| 6,773,873 B2 | 8/2004 | Seijo et al. |
| 6,800,218 B2 | 10/2004 | Ma et al. |
| 6,802,983 B2 | 10/2004 | Mullee et al. |
| 6,849,200 B2 | 2/2005 | Baum et al. |
| 6,875,733 B1 | 4/2005 | Wojtczak et al. |
| 6,896,826 B2 | 5/2005 | Wojtczak et al. |
| 6,943,139 B2 | 9/2005 | Korzenski et al. |
| 6,989,358 B2 | 1/2006 | Korzenski et al. |
| 7,011,716 B2 | 3/2006 | Xu et al. |
| 7,029,373 B2 | 4/2006 | Ma et al. |
| 7,030,168 B2 | 4/2006 | Xu et al. |
| 7,119,052 B2 | 10/2006 | Korzenski et al. |
| 7,119,418 B2 | 10/2006 | Xu et al. |
| 7,160,815 B2 | 1/2007 | Korzenski et al. |
| 7,223,352 B2 | 5/2007 | Korzenski et al. |
| 7,300,601 B2 | 11/2007 | Liu et al. |
| 7,326,673 B2 | 2/2008 | Xu et al. |
| 7,335,239 B2 | 2/2008 | Baum |
| 7,361,603 B2 | 4/2008 | Liu et al. |
| 7,365,045 B2 | 4/2008 | Walker et al. |
| 7,485,611 B2 | 2/2009 | Roeder et al. |
| 7,534,752 B2 | 5/2009 | Wojtczak et al. |
| 7,553,803 B2 | 6/2009 | Korzenski et al. |
| 7,557,073 B2 | 7/2009 | Korzenski et al. |
| 7,736,405 B2 | 6/2010 | Darsillo et al. |
| 7,888,301 B2 | 2/2011 | Bernhard et al. |
| 7,922,824 B2 | 4/2011 | Minsek et al. |
| 7,923,423 B2 | 4/2011 | Walker et al. |
| 7,960,328 B2 | 6/2011 | Visintin et al. |
| 8,026,200 B2 | 9/2011 | Cooper et al. |
| 8,058,219 B2 | 11/2011 | Rath et al. |
| 8,114,220 B2 | 2/2012 | Visintin et al. |
| 8,178,585 B2 | 5/2012 | Petruska et al. |
| 8,236,485 B2 | 8/2012 | Minsek et al. |
| 8,304,344 B2 | 11/2012 | Boggs et al. |
| 8,338,087 B2 | 12/2012 | Rath et al. |
| 8,367,555 B2 | 2/2013 | Afzali-Ardakani et al. |
| 8,618,036 B2 | 12/2013 | Afzali-Ardakani et al. |
| 8,685,909 B2 | 4/2014 | Angst et al. |
| 8,709,277 B2 * | 4/2014 | Takahashi ......... H01L 21/82387 216/100 |
| 8,754,021 B2 | 6/2014 | Barnes et al. |
| 8,778,210 B2 | 7/2014 | Cooper et al. |
| 8,822,396 B2 | 9/2014 | Nakamura et al. |
| 8,951,948 B2 | 2/2015 | Rath et al. |
| 9,045,717 B2 | 6/2015 | Nakanishi et al. |
| 9,063,431 B2 | 6/2015 | Barnes et al. |
| 9,074,169 B2 | 7/2015 | Chen et al. |
| 9,074,170 B2 | 7/2015 | Barnes et al. |
| 9,175,404 B2 | 11/2015 | Kojima et al. |
| 9,215,813 B2 | 12/2015 | Brosseau et al. |
| 9,221,114 B2 | 12/2015 | Chen et al. |
| 9,238,850 B2 | 1/2016 | Korzenski et al. |
| 9,416,338 B2 | 8/2016 | Cooper et al. |
| 9,520,617 B2 | 12/2016 | Cooper |
| 2005/0118832 A1 | 6/2005 | Korzenski et al. |
| 2005/0145311 A1 | 7/2005 | Walker et al. |
| 2005/0202987 A1 | 9/2005 | Small et al. |
| 2005/0227482 A1 | 10/2005 | Korzenski et al. |
| 2005/0263490 A1 | 12/2005 | Liu et al. |
| 2006/0019850 A1 | 1/2006 | Korzenski et al. |
| 2006/0063687 A1 | 3/2006 | Minsek et al. |
| 2006/0148666 A1 | 7/2006 | Peters et al. |
| 2006/0154186 A1 | 7/2006 | Minsek et al. |
| 2006/0249482 A1 | 11/2006 | Wrschka et al. |
| 2007/0251551 A1 | 11/2007 | Korzenski et al. |
| 2008/0076688 A1 | 3/2008 | Barnes et al. |
| 2008/0125342 A1 | 5/2008 | Visintin et al. |
| 2008/0171682 A1 | 7/2008 | Kane et al. |
| 2008/0210900 A1 * | 9/2008 | Wojtczak ......... H01L 21/31111 252/79.3 |
| 2008/0271991 A1 | 11/2008 | Korzenski et al. |
| 2009/0032766 A1 | 2/2009 | Rajaratnam et al. |
| 2009/0192065 A1 | 7/2009 | Korzenski et al. |
| 2009/0212021 A1 | 8/2009 | Bernhard et al. |
| 2009/0215269 A1 | 8/2009 | Boggs et al. |
| 2009/0253072 A1 | 10/2009 | Petruska et al. |
| 2009/0301996 A1 | 12/2009 | Visintin et al. |
| 2010/0056410 A1 | 3/2010 | Visintin et al. |
| 2010/0065530 A1 | 3/2010 | Walker et al. |
| 2010/0087065 A1 | 4/2010 | Boggs et al. |
| 2010/0112728 A1 | 5/2010 | Korzenski et al. |
| 2010/0163788 A1 | 7/2010 | Visintin et al. |
| 2010/0261632 A1 | 10/2010 | Korzenski et al. |
| 2010/0286014 A1 | 11/2010 | Barnes |
| 2011/0039747 A1 | 2/2011 | Zhou et al. |
| 2011/0117751 A1 | 5/2011 | Sonthalia et al. |
| 2011/0275164 A1 | 11/2011 | Visitin et al. |
| 2013/0270217 A1 | 10/2013 | Yoshida et al. |
| 2013/0280123 A1 | 10/2013 | Chen et al. |
| 2013/0295712 A1 | 11/2013 | Chen et al. |
| 2014/0038420 A1 | 2/2014 | Chen et al. |
| 2014/0306162 A1 | 10/2014 | Poe et al. |
| 2014/0318584 A1 | 10/2014 | Cooper et al. |
| 2015/0027978 A1 | 1/2015 | Barnes et al. |
| 2015/0045277 A1 | 2/2015 | Liu et al. |
| 2015/0050199 A1 | 2/2015 | Korzenski et al. |
| 2015/0075570 A1 | 3/2015 | Wu et al. |
| 2015/0114429 A1 | 4/2015 | Jenq et al. |
| 2015/0162213 A1 | 6/2015 | Chen et al. |
| 2015/0168843 A1 | 6/2015 | Cooper et al. |
| 2015/0344825 A1 | 12/2015 | Cooper et al. |
| 2016/0020087 A1 | 1/2016 | Liu et al. |
| 2016/0032186 A1 | 2/2016 | Chen et al. |
| 2016/0075971 A1 | 3/2016 | Liu et al. |
| 2016/0122696 A1 | 5/2016 | Liu et al. |
| 2016/0130500 A1 | 5/2016 | Chen et al. |
| 2016/0185595 A1 | 6/2016 | Chen et al. |
| 2016/0200975 A1 | 7/2016 | Cooper et al. |

FOREIGN PATENT DOCUMENTS

| | | |
|---|---|---|
| EP | 527738 A1 | 2/1993 |
| JP | H11-016879 A | 1/1999 |
| JP | 2005522027 A | 7/2005 |
| JP | 2007-328153 A | 12/2007 |
| JP | 2008-084883 A | 4/2008 |
| JP | 2010-524208 A | 7/2010 |
| JP | 2011159658 A | 8/2011 |
| JP | 2012-036750 A | 2/2012 |
| JP | 2012021151 A | 2/2012 |
| JP | 2012062572 A | 3/2012 |
| JP | 2012186470 A | 9/2012 |
| JP | 2012251026 A | 12/2012 |
| JP | 2015-517691 A | 6/2015 |
| TW | 200702944 A | 1/2007 |
| WO | 2004-019134 A1 | 3/2004 |
| WO | 2006110645 A2 | 10/2006 |

(56) References Cited

FOREIGN PATENT DOCUMENTS

| WO | 2006127885 A1 | 11/2006 |
|---|---|---|
| WO | 2007027522 A2 | 3/2007 |
| WO | 2008036823 A2 | 3/2008 |
| WO | 2008157345 A2 | 12/2008 |
| WO | 2009073596 A2 | 6/2009 |
| WO | 2010017160 A2 | 2/2010 |
| WO | 2010039936 A2 | 4/2010 |
| WO | 2010086745 A1 | 8/2010 |
| WO | 2010091045 A2 | 8/2010 |
| WO | 2012154498 A2 | 11/2012 |
| WO | 2012174518 A2 | 12/2012 |
| WO | 2013058770 A1 | 4/2013 |
| WO | 2013138278 A1 | 9/2013 |
| WO | 2015/014203 A1 | 2/2015 |
| WO | 2015/028593 A1 | 3/2015 |
| WO | 2015095175 A1 | 6/2015 |
| WO | 2015/103146 A1 | 7/2015 |
| WO | 2015/116679 A1 | 8/2015 |
| WO | 2015/116818 A1 | 8/2015 |
| WO | 2015130607 A1 | 9/2015 |

OTHER PUBLICATIONS

Puppo, D.H., et al., "Photoresist removal using gaseous sulfur trioxide cleaning technology," Optomechatronic Micro/Nano Devices and Components XIII, The International Society for Optical Engineering (SPIE), vol. 3677, No. PART J1/02, Mar. 1999, pp. 1034-1045.

* cited by examiner

Site 1

Site 2

Site 1

Site 2

USE OF NON-OXIDIZING STRONG ACIDS FOR THE REMOVAL OF ION-IMPLANTED RESIST

CROSS REFERENCE TO RELATED APPLICATIONS

This application is a continuation application of co-pending U.S. application Ser. No. 15/105,833, filed on Jun. 17, 2016, which is an application filed under the provisions of 35 U.S.C. § 371 claiming priority of International Patent Application No. PCT/US2014/071540 filed on Dec. 19, 2014, entitled, "USE OF NON-OXIDIZING STRONG ACIDS FOR THE REMOVAL OF ION-IMPLANTED RESIST" that claims priority to U.S. Provisional Patent Application No. 61/919,177 filed Dec. 20, 2013 in the name of Steven Bilodeau et al. entitled "Use of Non-Oxidizing Strong Acids for the Removal of Ion-Implanted Resist," to U.S. Provisional Patent Application No. 62/046,495 filed Sep. 5, 2014 in the name of Steven Bilodeau et al. entitled "Use of Non-Oxidizing Strong Acids for the Removal of Ion-implanted Resist," and to U.S. Provisional Patent Application No. 62/045,946 filed Sep. 4, 2014 in the name of Steven Bilodeau et al. entitled "Stripping of Ion-Implanted Resist Using Compositions that are Compatible with Germanium," each of which is incorporated by reference herein in their entirety.

FIELD

The present invention relates generally to a composition and process of removing resist, specifically ion-implanted resist, from a microelectronic device comprising same. The composition and method as disclosed selectively removes said resist relative to germanium-containing materials.

DESCRIPTION OF THE RELATED ART

Resist, including photoresist, is a radiation sensitive (e.g., light radiation sensitive) material used to form a patterned layer on a substrate (e.g., a semiconductor wafer) during semiconductor device fabrication. After exposing a portion of a resist coated substrate to radiation, either the exposed portion of the resist (for positive resist), or the unexposed portion of the resist (for negative resist) is removed to reveal the underlying surface of the substrate, leaving the rest of the surface of the substrate coated and protected by resist. Resist may be more generally referred to as a masking material. Other fabrication processes such as ion-implanting, etching, or depositing may be performed on the uncovered surface of the substrate and the remaining resist. After performing the other fabrication processes, the remaining resist is removed in a strip operation.

In ion-implantation, dopant ions (e.g., ions of boron, boron difluoride, arsenic, indium, gallium, phosphorous, germanium, antimony, xenon or bismuth) are accelerated toward a substrate to be implanted. The ions are implanted in the exposed regions of the substrate as well as in the remaining resist. Ion-implantation may be used, for example, to form implanted regions in the substrate such as the channel region and source and drain regions of transistors. Ion-implantation may also be used to form lightly doped drain and double diffused drain regions. However, high-dose ions implanted in the resist may deplete hydrogen from the surface of the resist causing the resist to form an outer layer or crust, which may be a carbonized layer that is harder than the underlying portion of the resist layer (i.e., the bulk portion of the resist layer). The outer layer and the bulk portion have different thermal expansion rates and react to stripping processes at different rates.

An important aspect of resist stripping concerns damage to the substrate, or undesirable removal of a portion of the substrate, that may result from resist stripping. Such damage is undesirable because it may cause structures and devices formed in or on the substrate (e.g., transistors or other electronic devices formed in or on a semiconductor wafer) not to function or to function poorly. The damage may involve dissolution (etching), conversion to different solid phases such as oxides, or a combination of both. For example, the typical methods for removing implanted resist utilize strongly oxidizing media, either in the gas phase (oxidizing plasmas) or in the liquid phase (e.g., sulfuric acid+peroxide or "SPM"). These methods do not work well for germanium-containing substrates because they are kinetically more sensitive to oxidation than silicon, in part because germanium oxide is more soluble and a poor protector of the surface (unlike SiO2).

Accordingly, there is a need for a new composition and method that effectively and efficiently remove ion-implanted resist, that does not utilize strong oxidizers, is fast enough to be used in single wafer tools, causes minimal germanium loss, and leaves behind a smooth germanium surface that is stable to oxidation at least through typical fab queue times. In addition, high selectivity to other substrates is desirable, for example, silicon, silicon oxide, and silicon nitride.

BRIEF DESCRIPTION OF THE DRAWINGS

FIG. 2A shows a cross-sectional analysis following removal and FIG. 2B shows the AFM scan following removal.

FIG. 3A shows a cross-sectional analysis following removal and FIG. 3B shows the AFM scan following removal.

FIG. 4A shows a cross-sectional analysis following removal and FIG. 4B shows the AFM scan following removal.

SUMMARY

Figure 1:
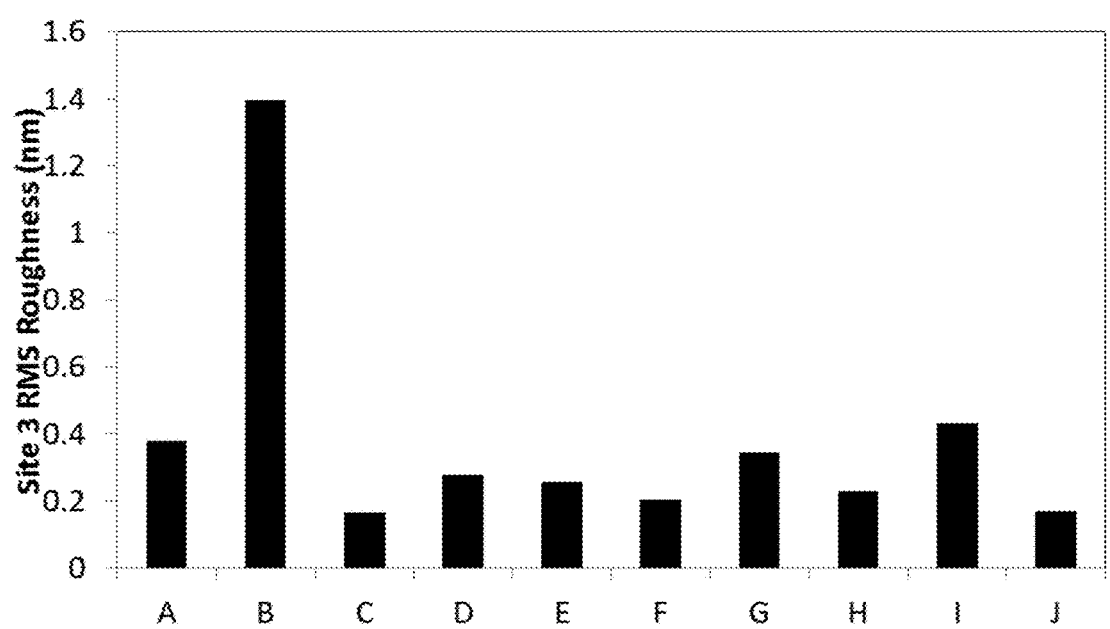
FIG. 1 illustrates the RMS roughness of following resist removal using Formulations A-J.

The present invention relates generally to a composition and method of removing resist, specifically ion-implanted resist, from a microelectronic device comprising same. The composition and method as disclosed effectively removes said resist while not substantially damaging other materials present on the device surface, such as silicon-containing materials and germanium-containing materials.

In one aspect, a method of removing resist from a microelectronic device surface having same thereon is described, said method comprising contacting a composition to the microelectronic device surface at conditions necessary to substantially remove the resist from the microelectronic device surface, wherein the composition comprises at least one non-oxidizing acid and at least one fluoride and/or bromide compound, with the proviso that the composition is substantially devoid of oxidizers.

In another aspect, a method of removing resist from a microelectronic device surface having same thereon is described, said method comprising contacting a composition to the microelectronic device surface at conditions necessary to substantially remove the resist from the microelectronic device surface, wherein the composition comprises a sulfur-containing acid, HCl, and optionally at least one fluoride and/or bromide compound, wherein the HCl is generated using either HCl (hydrogen chloride) added as a dissolved gas or an HCl-generating compound.

In still another aspect, a composition for stripping resist, specifically ion-implanted resist, from a microelectronic device comprising same is described, said composition comprising at least one non-oxidizing acid, at least one of a fluoride species and/or a bromide compound, and at least one compound that lowers the melting point of the composition, with the proviso that the composition is substantially devoid of oxidizers.

In yet another aspect, a composition for stripping resist, specifically ion-implanted resist, from a microelectronic device comprising same is described, said composition comprising at least one non-oxidizing acid, at least one of a fluoride species and/or a bromide compound, and at least one compound that lowers the melting point of the composition, with the proviso that the composition is substantially devoid of oxidizers.

Other aspects, features and advantages of the invention will be more fully apparent from the ensuing disclosure and appended claims.

DETAILED DESCRIPTION AND PREFERRED EMBODIMENTS THEREOF

The present invention relates generally to a composition and method of removing resist, specifically ion-implanted resist, from a microelectronic device comprising same. The composition and method as disclosed effectively removes said resist while not substantially damaging other materials present on the device surface, such as silicon-containing materials and germanium-containing materials.

For ease of reference, "microelectronic device" corresponds to semiconductor substrates, flat panel displays, phase change memory devices, solar panels and other products including solar cell devices, photovoltaics, and microelectromechanical systems (MEMS), manufactured for use in microelectronic, integrated circuit, energy collection, or computer chip applications. It is to be understood that the terms "microelectronic device," "microelectronic substrate" and "microelectronic device material" are not meant to be limiting in any way and include any substrate or structure that will eventually become a microelectronic device or microelectronic assembly "Ion-implantation" is a process by which ions of a dopant material can be implanted into target material, usually a solid. Ion-implantation is used in semiconductor device fabrication, for example, in the fabrication of integrated circuits and silicon semiconductor devices. The implanted ions may introduce or cause a chemical change in the target due to the ions being a different element than the target, and/or a structural change, in that the target may be modified, damaged or even destroyed by ion-implantation. By way of example only, elements that are typically used for implanted species in semiconductor fabrication include boron, boron difluoride, arsenic, indium, gallium, germanium, bismuth, xenon, phosphorus and antimony. Boron is a p-type dopant in silicon because it donates or causes a "hole" (i.e., electron vacancy) in the silicon. Arsenic is an n-type dopant in silicon because it donates or causes an extra electron in the silicon. Dopants, such as boron and arsenic, implanted in intrinsic silicon, may cause the intrinsic silicon to become conductive as a semiconductor. One or more dopant materials may be implanted into a target material. Ion-implantation is usually characterized by dose and energy. The dose is the number of ions that are implanted per area of target material. The energy is the energy of the ions being implanted. More advanced semiconductor processing or fabrication technologies typically use higher dose and/or higher energy than older technologies.

"Resist" including "photoresist" is a radiation sensitive material that is used to form a patterned coating on a surface, for example, the surface of a substrate or target. Resists are used in the fabrication of semiconductor devices, for example, integrated circuits and silicon semiconductor devices. One use of resists in the fabrication of semiconductor devices is as a mask for selective ion-implantation of dopants into a semiconductor substrate. A layer of resist is applied to the surface of the semiconductor substrate, or to the surface of a layer on or within the substrate, such as an insulator layer above a semiconductor layer. A portion of the resist is exposed to the radiation, such portion of the resist corresponding to either the area of the semiconductor to be implanted (positive resist) or to the area of the semiconductor not to be implanted (negative resist). The resist is then exposed to a developer which assists in removing a portion of the resist so that only the desired portion of the resist remains. "Positive resist" is a type of resist in which the portion of the resist that is exposed to the radiation becomes soluble to, and removed by, the resist developer. The portion of the resist that is unexposed remains insoluble to, and is not removed by, the resist developer. "Negative resist" is a type of resist in which the portion of the resist that is exposed to the radiation becomes insoluble to, and not removed by, the photoresist developer. The portion of the resist that is not exposed to radiation remains soluble to, and is removed by, the resist developer. The soluble portion of resist is dissolved by the resist developer. Ion-implantation occurs after the resist is patterned by exposure to the radiation and developed by the developer. The remaining portion of the resist blocks the implanted ions from reaching the semiconductor, or other material, below the resist. The ions blocked by the resist are implanted into the resist instead of the underlying substrate. The portions of the semiconductor not covered by resist are ion-implanted.

Because of the relatively high dose and/or high energy of the implanted ions blocked by the resist, the resist forms a crust or hard shell on the outer portions or outer sides of the resist where the ions impact and are absorbed. The resist hardening may result from, or be referred to as, carbonization, polymerizing or polymer cross-linking. Specifically, the ions penetrating into the outer regions of the resist may cause the outer regions of the resist (e.g., top and sides of the resist) to become a crust, and chemical bonds in the inner regions of the resist close to the outer regions to become cross-linked. The crust is known to be difficult to remove during a resist stripping process (e.g., the crust is insoluble in some known solvents used for stripping). Because the ions only penetrate a limited distance into the resist material, the crust is formed mostly on the outer portions of the resist. Because the bottom of the resist is covered by the implanted material or substrate, the crust may form on the top and side surfaces of the resist, but not on the bottom portion or in the interior portion of the resist. For typical resist, the top crust is thicker than the side crust because the ions are usually implanted primarily with a downward direction of incidence. The thickness of the resist crust is dependent upon the dosage of the implanted ions and the ion-implant energy. The resist material that is inside or beneath the crust, that is, the portion of the resist that is generally unaffected by the ions, is referred to as bulk resist or bulk resist material. The hardening or crusting of the resist, for example, renders the outer portion of the resist insoluble, or less soluble, in water or in some other aqueous solutions (although, not necessarily in all other aqueous solutions or in all organic solvents).

"Silicon" may be defined to include, Si, polycrystalline Si, and monocrystalline Si, as well as other silicon-containing materials such as silicon oxide, thermal oxide, SiOH and SiCOH. Silicon is comprised in silicon-on-insulator (SOI) wafers that may be used, for example, as substrates or part of a substrate for electronic devices such as FETs and integrated circuits. Other types of wafers may also comprise silicon.

As used herein, "silicon-containing materials" correspond to silicon; silicon oxide, including gate oxides (e.g., thermally or chemically grown $SiO_2$) and TEOS; silicon nitride; and low-k dielectric materials. As defined herein, "low-k dielectric material" corresponds to any material used as a dielectric material in a layered microelectronic device, wherein the material has a dielectric constant less than about 3.5. Preferably, the low-k dielectric materials include low-polarity materials such as silicon-containing organic polymers, silicon-containing hybrid organic/inorganic materials, organosilicate glass (OSG), TEOS, fluorinated silicate glass (FSG), silicon dioxide, and carbon-doped oxide (CDO) glass. It is to be appreciated that the low-k dielectric materials may have varying densities and varying porosities.

As defined herein, "substantially devoid" corresponds to less than about 2 wt. %, more preferably less than 1 wt. %, and most preferably less than 0.1 wt. % of the composition, based on the total weight of said composition. "Devoid" corresponds to 0 wt. % of the composition.

As used herein, "fluoride" species correspond to species including an ionic fluoride (F) or hydrolysable covalently bonded fluorine. It is to be appreciated that the fluoride species may be included as a fluoride species or generated in situ.

As defined herein, the "germanium-containing materials" may be a bulk germanium wafer, a germanium-on-insulator (GOI) wafer in which case the layer is a germanium layer formed on a dielectric layer on top of the substrate, a germanium layer on a substrate, a Ge—Sn alloy, or a SiGe material regardless of the percentage of Si:Ge. The germanium-containing material can be a continuous layer that at least partially extends over the substrate or can be divided into separate regions.

As defined herein, a "non-oxidizing acid" corresponds to an acid that has a standard oxidation/reduction potential of less than about +0.25 V versus the standard hydrogen electrode. Examples of non-oxidizing acids include sulfuric acid, phosphoric and phosphonic acids, and most organic (e.g., carboxylic) acids, but not nitric or any "halate" acids (i.e., halogen+oxygen such as iodate, perchlorate, hypochlorite etc).

As defined herein, "oxidizers" include, but are not limited to, hydrogen peroxide, $FeCl_3$, $FeF_3$, $Fe(NO_3)_3$, $Sr(NO_3)_2$, $CoF_3$, $MnF_3$, oxone ($2KHSO_5.KHSO_4.K_2SO_4$), periodic acid, iodic acid, vanadium (V) oxide, vanadium (IV,V) oxide, ammonium vanadate, ammonium peroxomonosulfate, ammonium chlorite, ammonium chlorate, ammonium iodate, ammonium nitrate, ammonium perborate, ammonium perchlorate, ammonium periodate, ammonium persulfate, ammonium hypochlorite, ammonium hypobromite, ammonium tungstate, sodium persulfate, sodium hypochlorite, sodium perborate, sodium hypobromite, potassium iodate, potassium permanganate, potassium persulfate, nitric acid, potassium persulfate, potassium hypochlorite, tetramethylammonium chlorite, tetramethylammonium chlorate, tetramethylammonium iodate, tetramethylammonium perborate, tetramethylammonium perchlorate, tetramethylammonium periodate, tetramethylammonium persulfate, tetrabutylammonium peroxomonosulfite, peroxomonosulfuric acid, ferric nitrate, urea hydrogen peroxide, peracetic acid, 1,4-benzoquinone, toluquinone, dimethyl-1,4-benzoquinone, dichloro-1,4-benzoquinone, chloranil, alloxan, N-methylmorpholine N-oxide, trimethylamine N-oxide, cerium ammonium nitrate, ceric nitrate, ceric ammonium sulfate, eerie sulfate, ceric bisulfate, ceric perchlorate, eerie methanesulfonate, ceric trifluoromethanesulfonate, ceric chloride, ceric hydroxide, ceric carboxylate, ceric β-diketone, ceric trifluoroacetate and eerie acetate, and combinations thereof.

Four important aspects of resist stripping are: (i) stripping at relatively low temperatures; (ii) relatively short times for resist stripping to allow for acceptable wafer throughput, (iii) substantially complete removal of resist from the microelectronic device surface; and (iv) minimizing or substantially eliminating the damage to, or undesirable removal of, other materials (e.g., silicon-containing materials, germanium-containing materials, or both) from the microelectronic device surface that may result from resist stripping. The damage, for example, may involve dissolution (etching), conversion to different solid phases such as oxides, or a combination of both.

In a first aspect, a composition for stripping resist, specifically ion-implanted resist, from a microelectronic device comprising same is described. In one embodiment, the composition for stripping resist comprises, consists of, or consists essentially of at least one non-oxidizing acid and at least one fluoride and/or bromide compound, with the proviso that die composition is substantially devoid of oxidizers. In another embodiment, the composition for stripping resist comprises, consists of, or consists essentially of at least one non-oxidizing acid, at least one fluoride and/or bromide compound, and at least one acid-resistant surfactant, with the proviso that the composition is substantially devoid of oxidizers. In yet another embodiment, the composition for stripping resist comprises, consists of, or consists essentially of at least one non-oxidizing acid and at least one acid-resistant surfactant, with the proviso that the composition is substantially devoid of oxidizers. In general, the specific proportions and amounts of components, in relation to each other, may be suitably varied to provide the desired removal action of the composition for the resist and/or processing equipment, as readily determinable within the skill of the art without undue effort.

The compositions of the first aspect are substantially devoid of added water and organic solvents. It is understood that some commercial components include a small amount of water, however, preferably no additional water is added to the composition described herein. Accordingly, the compositions of the first aspect include less than about 5 wt % added water, more preferably less than 3 wt % added water, even more preferably less than 2 wt % added water, and most preferably less than 1 wt % added water, based on the total weight of the composition. Water that is present in the commercially purchased components (e.g., hydrogen fluoride) is not considered "added water." Furthermore, the compositions of the first aspect are also preferably substantially devoid of at least one of chemical mechanical polishing abrasive material, strong bases (e.g., alkali and alkaline metal hydroxides and quaternary ammonium hydroxides), and amines. As defined herein, "amine" species include at least one primary, secondary, and tertiary amines, with the proviso that (i) species including both a carboxylic acid group and an amine group, (ii) surfactants that include amine groups, and (iii) species where the amine group is a substituent (e.g., attached to an aryl or heterocyclic moiety) are not considered "amines" according to this definition. The amine formula can be represented by $NR^1R^2R^3$, wherein $R^1$, $R^2$ and $R^3$ can be the same as or different from one another and are selected from the group consisting of hydrogen, straight-chained or branched $C_1$-$C_6$ alkyls (e.g., methyl, ethyl, propyl, butyl, pentyl hexyl), $C_6$-$C_{10}$ aryls (e.g., benzyl), straight-chained or branched $C_1$-$C_6$ alkanols (e.g., methanol, ethanol, propanol, butanol, pentanol, hexanol), and combinations thereof, with the proviso that $R^1$, $R^2$ and $R^3$ cannot all be hydrogen.

The non-oxidizing acids are present to principally protonate and dissolve the photoresist. Non-oxidizing acids contemplated herein include, but are not limited to, methanesulfonic acid, oxalic acid, citric acid, tartaric acid, picolinic acid, succinic acid, acetic acid, lactic acid, sulfosuccinic acid, benzoic acid, propionic acid, formic acid, pyruvic acid, oxalic acid, maleic acid, malonic acid, fumaric acid, malic acid, ascorbic acid, mandelic acid, heptanoic acid, butyric acid, valeric acid, glutaric acid, phthalic acid, hypophosphorous acid, salicylic acid, 5-sulfosalicylic acid, ethanesulfone acid, butanesulfonic acid, p-toluenesulfonic acid, dichloroacetic acid, difluoroacetic acid, monochloroacetic acid, monofluoroacetic acid, hydrochloric acid, trichloroacetic acid, trifluoroacetic acid, hydrobromic acid (62 wt %), sulfuric acid, and combinations thereof. Preferably, the non-oxidizing acids comprise methanesulfonic acid (99%), hydrochloric acid (conc.), trifluoroacetic acid, hydrobromic acid (62%), sulfuric acid (95-98%), or combinations thereof. The amount of non-oxidizing acids in the composition is preferably greater than 90 wt %, more preferably greater than 95 wt %, and most preferably greater than 98 wt %.

The at least one fluoride and/or bromide compound is thought to improve the removal of the encrusted resist material at the edges of resist-covered areas (i.e., "rails"). Fluoride compounds contemplated include hydrofluoric acid. Alternatively, fluoride compounds other than HF may be beneficial for maintaining compatibility with silicon-containing materials including, but not limited to, tetrafluoroboric acid, hexafluorotitanic acid, hexafluorosilicic acid, hexafluorozirconic acid, tetrafluoboric acid, tetrabutylammonium trifluoromethanesulfonate tetraalkylammonium tetrafluoroborates ($NR_1R_2R_3R_4BF_4$) such as tetrabutylammonium tetrafluoroborate, tetraalkylammonium hexafluorophosphates ($NR_1R_2R_3R_4PF_6$), tetraalkylammonium fluorides ($NR_1R_2R_3R_4F$) (anhydrous or hydrates thereof) such as tetramethylammonium fluoride, ammonium bifluoride, ammonium fluoride, where $R_1$, $R_2$, $R_3$, $R_4$ may be the same as or different from one another and is selected from the group consisting of hydrogen, straight-chained or branched $C_1$-$C_6$ alkyl groups (e.g., methyl, ethyl, propyl, butyl, pentyl, hexyl), $C_1$-$C_6$ alkoxy groups (e.g., hydroxyethyl, hydroxypropyl) substituted or unsubstituted aryl groups (e.g., benzyl). Preferably, the fluoride species comprises hydrofluoric acid. Bromide compounds contemplated include hydrobromic acid and any other compound that results in mostly HBr in solution at low pHs. When present, the amount of hydrofluoric acid is in a range from about 0.01 wt % to about 1 wt %, more preferably 0.1 wt % to about 0.4 wt %. When present, the amount of fluoride compound(s) other than HF and/or bromide compound(s) is in a range from about 0.01 wt % to about 8 wt %. The combination of fluoride and bromide compounds is contemplated herein.

Since the resist is partially removed by lift-off rather than dissolution, redeposition of particles on the wafers needs to be prevented. Towards that end, an acid-resistant surfactant can be optionally added for this purpose, which also assists in the lift-off process. For example, dodecylbenzene sulfonic acid (0.02-0.15%) can be added to MSA, or Novec 4300 (0.005-0.02%) can be added to concentrated hydrochloric acid. Other acid-resistant surfactants contemplated include benzalkonium chloride, the DOWFAX surfactants (Dow Chemical), and more generally long-chain quaternary ammonium cationic surfactants, long-chain sulfonic acid anionic surfactants, and fluorinated other-based non-ionic surfactants, in concentrations from about 0.002% to about 2%, when present.

The compositions of the first aspect can further include at least one dispersant including, but not limited to, heterocycles such as pyridine, imidazole, benzimidazole and piperidine, as well as derivatives of the heterocycles including at least one of $C_{1-10}$ alkyls, phenyl, benzyl, phenethyl, 3-phenylpropyl, benzyloxy, carboxyl, chloro, bromo, methoxy, nitro, and cyano groups, including, but not limited to, 4-benzylpyridine, 4-benzylpiperidine, 2-Benzylpyridine, 4-(4-Nitrobenzyl) pyridine, 4-(5-Nonyl)pyridine, 4-(3-Phenylpropyl)pyridine, 4-(3-Phenylpropyl)pyridine-N-oxide, 1-octylimidazole, 1-octylbenzimidazole, Poly(2-vinyl pyridine), Poly(4-vinyl pyridine), and co-polymers comprising one or both of the last two as components. As will be obvious to one skilled in the art, most of the dispersants may also be considered, and act as, surfactants.

In a second aspect, another composition for stripping resist, specifically ion-implanted resist, from a microelectronic device comprising same is described. The composition for stripping resist comprises, consists of, or consists essentially of at least one non-oxidizing acid, at least one fluoride and/or bromide compound, and at least one compound that lowers the melting point of the composition, with the proviso that the composition is substantially devoid of oxidizers. In another embodiment, the composition for stripping resist comprises, consists of, or consists essentially of at least one non-oxidizing acid, at least one fluoride and/or bromide compound, at least one acid-resistant surfactant, and at least one compound that lowers the melting point of the composition, with the proviso that the composition is substantially devoid of oxidizers. In yet another embodiment, the composition for stripping resist comprises, consists of, or consists essentially of at least one non-oxidizing acid, at least one acid-resistant surfactant, and at least one compound that lowers the melting point of the composition, with the proviso that the composition is substantially devoid of oxidizers. In general, the specific proportions and amounts of components, in relation to each other, may be suitably varied to provide the desired removal action of the composition for the resist and/or processing equipment, as readily determinable within the skill of the art without undue effort.

The compositions of the second aspect are substantially devoid of added water. It is understood that some commercial components include a small amount of water, however, preferably no additional water is added to the composition of the second aspect described herein. Accordingly, the compositions of the second aspect include less than about 5 wt % added water, more preferably less than 3 wt/% added water, even more preferably less than 2 wt % added water, and most preferably less than 1 wt % added water, based on the total weight of the composition. Water that is present in the commercially purchased components (e.g., hydrogen fluoride) is not considered "added water." Furthermore, the compositions of the second aspect are also preferably substantially devoid of at least one of chemical mechanical polishing abrasive material, strong bases (e.g., alkali and alkaline metal hydroxides and quaternary ammonium hydroxides), and amines.

The non-oxidizing acids are present to principally protonate and dissolve the photoresist. Non-oxidizing acids contemplated for the composition of the second aspect include those enumerated in the first aspect. Preferably, die non-oxidizing acids comprise methanesulfonic acid (99%), hydrochloric acid (conc.), trifluoroacetic acid, hydrobromic acid (62%), sulfuric acid (95-98%), or combinations thereof. The amount of non-oxidizing acids in the composition of the second aspect is preferably greater than 90 wt %, more preferably greater than 95 wt %, and most preferably greater than 98 wt %.

The at least one fluoride and/or bromide compound is thought to improve the removal of the encrusted resist material at the edges of resist-covered areas (i.e., "rails"). Fluoride and bromide compounds contemplated for the composition of the second aspect include those enumerated in the first aspect. Preferably, the fluoride compound comprises hydrofluoric acid. When present, the amount of hydrofluoric acid is in a range from about 0.01 wt % to about 1 wt %, more preferably 0.1 wt % to about 0.4 wt %. When present, the amount of fluoride compound(s) other than HF and/or bromide compound(s) is in a range from about 0.01 wt % to about 8 wt %. The combination of fluoride and bromide compounds is contemplated herein.

The acid-resistant surfactants, when present, are described hereinabove with regards to the first aspect.

It was surprisingly discovered that some combinations of the at least one non-oxidizing acid and at least one fluoride and/or bromide compound results in a composition that can have a relatively high melting point and can freeze in transit. Accordingly, at least one compound that lowers the melting point of the composition can be added to the at least one non-oxidizing acid and at least one fluoride and/or bromide compound, as readily determined by the person skilled in the art. Importantly, the at least one compound that lowers the melting point of the composition cannot degrade the capability of the composition at removing resist or the compatibility of the composition for underlying silicon-containing and germanium-containing materials and metal gate materials on the microelectronic device. The inventors previously discovered that the inclusion of at least one dialkyl sulfone in a composition, wherein the at least one dialkyl sulfone has the formula R—($SO_2$)—R', where R and R' can be the same as or different from one another and can be any $C_1$-$C_6$ alkyl group, lowers the melting temperature of the composition, as described in U.S. patent application Ser. No. 14/211,528, filed on Mar. 14, 2014 and entitled "Sulfolane Mixtures as Ambient Aprotic Polar Solvents," which is hereby incorporated by reference herein in its entirety. Accordingly, the at least one compound that lowers the melting point of the composition includes, but is not limited to, at least one dialkyl sulfone, wherein the at least one dialkyl sulfone has the formula R—($SO_2$)—R', where R and R' can be the same as or different from one another and can be any $C_1$-$C_6$ alkyl group, such as dimethylsulfone (also called methyl sulfonyl methane, MSM, $DMSO_2$), ethyl methyl sulfone, dipropyl sulfone, ethyl propyl sulfone, diethyl sulfone, dibutyl sulfone, and combinations thereof. In addition to, or alternatively, the at least one compound that lowers the melting point of the composition can include sulfuric acid and sulfolane. Preferably, the at least one compound that lowers the melting point of the composition comprises dimethyl sulfone, sulfolane or sulfuric acid. Dimethyl sulfone has solvent properties similar to sulfolane, but also advantageously has a high boiling point, high flash point, no known toxicity, and is highly stable.

The compositions of the second aspect can further include at least one dispersant including, but not limited to, heterocycles such as pyridine, imidazole, benzimidazole and piperidine, as well as derivatives of the heterocycles including at least one of $C_{1-10}$ alkyls, phenyl, benzyl, phenethyl, 3-phenylpropyl, benzyloxy, carboxyl, chloro, bromo, methoxy, nitro, and cyano groups, including, but not limited to, 4-benzylpyridine, 4-benzylpiperidine, 2-Benzylpyridine, 4-(4-Nitrobenzyl) pyridine, 4-(5-Nonyl)pyridine, 4-(3-Phenylpropyl)pyridine, 4-(3-Phenylpropyl)pyridine-N-oxide, 1-octylimidazol, 1-octylbenzimidazole, Poly(2-vinyl pyridine), Poly(4-vinyl pyridine), and co-polymers comprising one or both of the last two as components.

The compositions of the first and second aspect have pH less than about 2, more preferably less than about 1. It is to be appreciated that the pH of the composition of the first and second aspect may be less than zero or not even possible to measure with common instrumentation, depending on the components used and the amount thereof.

In another embodiment, the compositions of the first and second aspect further include bulk and hardened resist material, wherein the bulk and hardened resist material may comprise boron, arsenic, boron difluoride, indium, antimony, germanium, carbon and/or phosphorous ions. For example, the composition of the first and second aspect may include at least one non-oxidizing acid, at least one fluoride and/or bromide compound, and bulk and hardened resist material, with the proviso that the composition is substantially devoid of oxidizers. The resist material and implantation ions may be dissolved and/or suspended in the composition of the first and second aspect.

The compositions of the first and second aspect are compatible with underlying silicon-containing and germanium-containing materials and metal gate materials on the microelectronic device.

The compositions of the first and second aspect may be readily formulated as single-package formulations or multi-part formulations that are mixed at and/or before the point of use, e.g., the individual parts of the multi-part formulation may be mixed at the tool, in a storage tank upstream of the tool, or in a shipping package that delivers the mixed formulation directly to the tool. For example, a single shipping package may include at least two separate containers or bladders that may be mixed together by a user at the Fab and the mixed formulation may be delivered directly to the tool. The shipping package and the internal containers or bladders of the package must be suitable for storing and shipping said composition components, for example, packaging provided by Advanced Technology Materials. Inc. (Danbury, Conn., USA).

Alternatively, a concentrate of the composition of the first and second aspect may be formulated and packaged in one container for shipping and for mixture with on-site components prior to and/or during use, wherein said method of use is described herein. For example, the concentrate can be formulated for the addition of additional non-oxidizing acid prior to and/or during use.

In a third aspect, another composition for stripping resist, specifically ion-implanted resist, from a microelectronic device comprising same is described. In one embodiment, a composition is described, said composition comprising, consisting of, or consisting essentially of a sulfur-containing acid and HCl, wherein the HCl is generated using either HCl (hydrogen chloride) added as a dissolved gas or an HCl-generating compound. The amount of the HCl-generating compound in the composition is preferably in a range from about 0.1 wt % to about 10 wt, more preferably about 0.5 wt % to about 5 wt %. The remainder of the composition is the sulfur-containing acid. The composition of this embodiment is substantially devoid of added fluoride species and hydrogen peroxide and other oxidizers. For example, the sulfur-containing acid can be sulfuric acid and the HCl-generating compound can be thionyl chloride ($SOCl_2$) at typical concentrations of 1-5%, wherein the $SOCl_2$ reacts with the water present in the sulfuric acid and generates HCl and $SO_2$. In this example, most of the HCl evaporates but the solution remains saturated in HCl, and with a substantial content of $SO_2$ gas. In another example, the sulfur-containing acid can be sulfuric acid and the HCl-generating compound can be chlorosulfonic acid at typical concentrations of 0.5-5%, wherein the chlorosulfonic reacts with the water present in the sulfuric acid and generates HCl and $H_2SO_4$, wherein the composition is saturated in HCl Although not wishing to be bound by theory, it is thought that the chloridizing environment helps to "peel" the resist residues off the germanium-containing surface and leaves behind a hydrophobic surface, presumably covered with chloride. The hydrophobicity of the treated germanium-containing surface actually permits the water-based rinsing of the surfaces without significant damage to the substrate.

In another embodiment, the composition of the third aspect comprises, consists of, or consists essentially of a sulfur-containing acid, HCl, wherein the HCl is generated using either HCl (hydrogen chloride) added as a dissolved gas or an HCl-generating compound, and at least one fluoride and/or bromide compound. The amount of the HCl-generating compound in the composition is preferably in a range from about 0.1 wt % to about 10 wt %, more preferably about 0.5 wt % to about 5 wt %. The amount the fluoride and/or bromide compound is preferably in the range from about 0.1 wt % to about 5 wt %. The remainder of the composition is the sulfur-containing acid. The composition of this embodiment is substantially devoid of added water and hydrogen peroxide and other oxidizers.

Sulfur-containing acids include, but are not limited to, concentrated sulfuric acid, 100% sulfuric acid, "fuming" sulfuric acid (containing excess $SO_3$), chlorosulfonic acid ($ClSO_3H$), mixtures of chlorosulfonic acid and sulfuric acid, trifluoromethanesulfonic acid ($CF_3SO_3H$) and fluorosulfonic acid ($FSO_3H$).

HCl-generating compounds include, but are not limited to, thionyl chloride ($SOCl_2$), phosphoryl trichloride ($POCl_3$), sulfuryl chloride ($SO_2Cl_2$), boron trichloride ($BCl_3$), germanium tetrachloride ($GeCl_4$), chlorosulfonic acid, and combinations thereof. In addition, HCl can be added directly by bubbling HCl gas through the sulfur-containing acid or concentrated (35-38%) hydrochloric acid can be added directly to the sulfur-containing acid. A chloride salt, e.g., ammonium chloride or ethylammonium hydrochloride, can also be added as a source of HCl. Regardless of the source, the composition of the third aspect is preferably saturated in HCl.

When present, the at least one fluoride compound can be one of the fluoride compounds enumerated for the composition of the first aspect, preferably HF. When present, the at least one bromide species comprises HBr or any other source of bromide that will result in mostly HBr in solution at very low pHs.

In one embodiment of the third aspect, the composition includes sulfuric acid and $SOCl_2$. The reaction of $SOCl_2$ with the residual water in concentrated (95-98%) sulfuric acid is fairly fast under stirring conditions, and at room temperature dissolution nears completion (as evidenced by cessation of HCl bubbling) after 10-30 minutes.

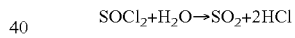

$$SOCl_2+H_2O \rightarrow SO_2+2HCl$$

In the case of $H_2SO_4$ and $SOCl_2$, vigorous stirring is needed because the solubility of $SOCl_2$ in concentrated sulfuric acid is <<1%, so for much of the reaction time the system is phase-separated. If desired, one can speed up the coalescence of the two phases by addition of a surfactant, e.g., a quaternary ammonium chloride such as dodecyltrimethylammonium chloride (DTAC), or of an organic solvent soluble and stable in concentrated sulfuric acid, e.g., sulfolane, dimethylsulfone, or a mixture of both. Much of the $SO_2$ generated by the hydrolysis reaction remains dissolved in the sulfuric acid, but most of the hydrogen chloride is lost by evaporation during the reaction, and some more is lost later if the solution is exposed to air. In a typical case the HCl content of $SOCl_2$-treated sulfuric acid decreased from an initial 0.185% in the fresh solution to 0.131% after 26 hours in an open jar.

For example, excellent results were obtained with 100% $H_2SO_4$ +5% $SOCl_2$, which is surprising because 100% $H_2SO_4$, while doing a good stripping job, caused pitting of Ge substrates. Although not wishing to be bound by theory, it is believed that the presence of S(IV) in the $H_2SO_4+SOCl_2$ mixture prevents it from acting as an oxidizer toward the germanium-containing substrate. Advantageously, for a composition including $H_2SO_4+SOCl_2$, etch rates of $SiO_x$, $SiN_x$ and Ge were all ≤0.1 Å/min at 40° C.

As mentioned hereinabove, at least one surfactant and/or at least one organic solvent can be added to assist with the solubility of the HCl-generating compound in the sulfur-containing compound. Accordingly, in another embodiment of the composition of the third aspect, the composition comprises, consists of, or consists essentially of a sulfur-containing acid, an HCl-generating compound, and at least one surfactant and/or at least one organic solvent.

The at least one surfactant can be a cationic quaternary surfactants with a C10-C16 alkyl chain, including, but not limited to, benzalkonium chloride, benzyldimethyldodecylammonium chloride, myristyltrimethylammonium bromide, dodecyltrimethylammonium bromide, dodecyltrimethylammonium chloride (DTAC), decyltrimethylammonium chloride, diallyldimethyl ammonium chloride, trimethyltetradecyl ammonium chloride, tetradecyldimethylbenzyl ammonium chloride, dodecyl(2-hydroxyethyl)dimethyl ammonium chloride, hexadecyl(2-hydroxyethyl)dimethyl ammonium chloride, dodecyl(2-hydroxyethyl)dimethyl ammonium bromide, hexadecyl(2-hydroxyethyl)dimethyl ammonium bromide, hexadecylpyridinium chloride, Aliquat 336 (Cognis), benzildimethylphenylammonium chloride, Crodaquat TES (Croda Inc.), Rewoquat CPEM (Witco), hexadecyltrimethylammonium p-toluenesulfonate, hexadecyltrimethylammonium hydroxide, 1-methyl-1'-tetradecyl-4,4'-bipyridium dichloride, alkyltrimethylammonium bromide, amprolium hydrochloride, benzethonium hydroxide, benzethonium chloride, benzyldimethylhexadecylammonium chloride, benzylditrimethyltetradecylammonium chloride, benzyldodecyldimethylammonium bromide, benzyldodecyldimethylammonium chloride, cetylpyridinium chloride, choline p-toluenesulfonate salt, dimethyldioctadecylammonium bromide, dodecylethyldimethylammonium bromide, dodecyltrimethylammonium chloride, ethylhexadecyldimethylammonium bromide, Girard's reagent, hexadecyl(2-hydroxyethyl)dimethylammonium dihydrogen phosphate, dexadecylpyridinium bromide, hexadecyltrimethylammonium bromide, hexadecyltrimethylammonium chloride, methylbenzethonium chloride, Hyamine® 1622, Luviquat™, N,N',N'-polyoxyethylene (10)-N-tallow-1,3-diaminopropane liquid, oxyphenonium bromide, tetraheptylammonium bromide, tetrakis(decyl)ammonium bromide, thonzonium bromide, tridodecylammonium chloride, trimethyloctadecylammonium bromide, 1-methyl-3-n-octylimidazolium tetrafluoroborate, 1-decyl-3-methylimidazolium tetrafluoroborate, 1-decyl-3-methylimidazolium chloride, tridodecylmethylammonium bromide, dimethyldistearylammonium chloride, and hexamethonium chloride. If a chloride surfactant like DTAC is used, it can be added and dissolved (with vigorous stirring) directly as a solid or as a concentrated solution (e.g., 25% DTAC can be made in 1:1 (w/w) sulfuric acid, so that water addition to the final mixture is minimized).

Organic solvents contemplated include, but are not limited to, sulfones such as sulfolane, dimethyl sulfone; anhydrides such as acetic anhydride; acid chlorides such as methanesulfonyl chloride, p-toluenesulfonyl chloride; and combinations thereof.

The compositions of the third aspect can further include at least one dispersant including, but not limited to, heterocycles such as pyridine, imidazole, benzimidazole and piperidine, as well as derivatives of the heterocycles including at least one of $C_{1-10}$ alkyls, phenyl, benzyl, phenethyl, 3-phenylpropyl, benzyloxy, carboxyl, chloro, bromo, methoxy, nitro, and cyano groups, including, but not limited to, 4-benzylpyridine, 4-benzylpiperidine, 2-Benzylpyridine, 4-(4-Nitrobenzyl) pyridine, 4-(5-Nonyl)pyridine, 4-(3-Phenylpropyl)pyridine, 4-(3-Phenylpropyl)pyridine-N-oxide, 1-octylimidazole, 1-octylbenzimidazole, Poly(2-vinyl pyridine), Poly(4-vinyl pyridine), and co-polymers comprising one or both of the last two as components.

The compositions of the third aspect are substantially devoid of added water. It is understood that some commercial components include a small amount of water, however, preferably no additional water is added to the composition described herein. Accordingly, the compositions of the third aspect include less than about 5 wt % added water, more preferably less than 3 wt % added water, even more preferably less than 2 wt % added water, and most preferably less than 1 wt % added water, based on the total weight of the composition. Water that is present in the commercially purchased components (e.g., concentrated $H_2SO_4$) is not considered "added water."

In another embodiment, the compositions of the third aspect further include bulk and hardened resist material, wherein the bulk and hardened resist material may comprise boron, arsenic, boron difluoride, indium, antimony, germanium, carbon and/or phosphorous ions. For example, the composition of the third aspect may include a sulfur-containing acid, HCl, wherein the HCl is generated using either HCl (hydrogen chloride) added as a dissolved gas or an HCl-generating compound, and bulk and hardened resist material, with the proviso that the composition is substantially devoid of fluoride species and oxidizers. Alternatively, the composition of the third aspect can include a sulfur-containing compound, HCl, wherein the HCl is generated using either HCl (hydrogen chloride) added as a dissolved gas or an HCl-generating compound, at least one fluoride and/or bromide compound, and bulk and hardened resist material. The resist maternal and implantation ions may be dissolved and/or suspended in the composition of the third aspect.

The compositions of the third aspect are compatible with underlying silicon-containing and germanium-containing materials and metal gate materials on the microelectronic device.

The compositions of the third aspect are preferably multi-part formulations that are mixed before the point of use, e.g., the individual parts of the multi-part formulation may be mixed in a storage tank upstream of the tool. Because stirring is necessary and HCl is generated in situ, the compositions should be used immediately or stored for short periods of time m a closed container to minimize degradation.

In one embodiment of the third aspect, a composition of the third aspect comprising HCl is replenished because the concentration of HCl decreases over time because of evaporation. Specifically, a method of replenishing the HCl in a composition of the third aspect comprises, consists, or consists essentially of:

combining water with sulfolane to make a first mixture;
adding an amount of chlorosulfonic acid to the first mixture to generate HCl in sulfolane to yield a second mixture, wherein the amount of chlorosulfonic acid is equimolar with the amount of water in the first mixture; and
replenishing the HCl in the composition of the third aspect by adding the second mixture to the composition of the third aspect, wherein the amount of the second mixture added is an amount necessary to at least partially replace HCl that previously evaporated from the composition of the third aspect.

In a fourth aspect, the compositions described herein are usefully employed to clean bulk and hardened resist from the surface of the microelectronic device. The microelectronic device of the fourth aspect may be a wafer, for example, a semiconductor wafer, upon or within which electronic devices are formed. The resist may be adhered to a surface of the wafer. The resist may have been ion-implanted during ion-implantation of the wafer. The ion-implantation of the resist may have caused a hardened, crusted, polymerized and/or carbonized outer layer to form in the resist. The compositions are formulated to preferentially not damage silicon-containing materials or germanium-containing materials, on the device surface. Preferably the compositions described herein remove at least 85% of the bulk and hardened resist present on the device prior to resist removal, more preferably at least 90%, even more preferably at least 95%, and most preferably at least 99%.

In removal application, the compositions can be applied in any suitable manner to the microelectronic device having resist material thereon, e.g., by spraying the composition on the surface of the device, by dipping (in a volume of the composition) of the device including the resist material, by contacting the device with another material, e.g., a pad, or fibrous sorbent applicator element, that is saturated with the composition, by contacting the device including the resist material with a circulating composition, or by any other suitable means, manner or technique, by which the composition is brought into contact with the resist material on the microelectronic device. The application may be in a batch or single wafer apparatus, for dynamic or static cleaning.

In use of the compositions described herein for removing bulk and hardened resist from microelectronic devices having same thereon, the compositions typically are contacted with the device for a time of from about 10 sec to about 60 minutes, preferably for 1 mm to 20 min, at temperature in a range of from about 20° C. to about 200° C. preferably about 20° C. to about 80° C. Such contacting times and temperatures are illustrative, and any other suitable time and temperature conditions may be employed that are efficacious to at least partially clean the bulk and hardened resist from the device. "At least partially clean" and "substantial removal" both correspond to removal of at least 85% of the and hardened resist present on the device prior to resist removal, more preferably at least 90%, even more preferably at least 95%, and most preferred at least 99%.

In one embodiment of the fourth aspect, a method of removing resist from a microelectronic device surface having same thereon comprises contacting a composition described herein to the microelectronic device surface at conditions necessary to substantially remove the resist from the microelectronic device surface. Preferably, the resist comprises bulk and ion-implanted resist material and the conditions comprise the aforementioned time and temperature.

In another embodiment of the fourth aspect, a method of removing resist from a microelectronic device surface having same thereon comprises:
contacting a composition of the first or second or third aspect to the microelectronic device surface for a first time at a first temperature necessary to at least partially remove resist from the microelectronic device surface; and
increasing the temperature of the composition to a second temperature to remove residual resist from the microelectronic device surface,
wherein the second temperature is greater than the first temperature. Preferably, the resist comprises bulk and ion-implanted resist material and the residual resist comprises encrusted resist material at the edges of resist-covered areas (i.e., "rails") or other resist that was not removed at the first temperature.

In another embodiment of the fourth aspect, a method of removing resist from a microelectronic device surface having same thereon comprises:
contacting the microelectronic device surface with a first composition for a first time at a first temperature necessary to at least partially remove resist from the microelectronic device surface; and
contacting the microelectronic device surface with a second composition for a second time at a second temperature necessary to remove residual resist from the microelectronic device surface,
wherein the first time can be the same as or different from the second time, wherein the first temperature can be the same as or less than the second temperature, and wherein the first composition is a composition of the first or second or third aspect having no fluoride species or a composition of the first or second or third aspect having a concentration of fluoride species that is lower than the concentration of fluoride species in the second composition. The second composition is a composition of the first or second or third aspect having at least one fluoride species. Preferably, the resist comprises bulk and ion-implanted resist material and the residual resist comprises encrusted resist material at the edges of resist-covered areas (i.e., "rails") or other resist that was not removed with the first composition.

Following the achievement of the desired removal action, the compositions described herein may be readily removed from the device to which they have previously been applied, as may be desired and efficacious in a given end use application of the compositions described herein. The rinse solution can comprise at least one of dimethyl sulfoxide (DMSO), isopropanol, N-methylpyrrolidone (NMP), dimethylacetamide, sulfolane and other sulfones, methanol, and gamma-butyrolactone. When the composition includes an HCl-generating component such as chlorosulfonic acid, the rinse solution can further comprise water, in addition to the aforementioned rinse components. In one embodiment, the rinse process includes a DMSO rinse followed by an isopropanol rinse. In another embodiment, the rinse process includes a isopropanol rinse. In another embodiment, the rinse process includes a water rinse followed by an isopropanol rinse. In yet another embodiment, the rinse process includes a rinse with an aqueous surfactant solution followed by deionized water and by isopropanol. Thereafter, the device may be dried using nitrogen or a spin-dry cycle.

Yet another aspect relates to the improved microelectronic devices made according to the methods described herein and to products containing such microelectronic devices.

Another aspect relates to a composition of the first or second aspect that is reused, wherein the composition may be reused until loading with components of the photoresist reaches the maximum amount the composition may accommodate, as readily determined by one skilled in the art. It should be appreciated by one skilled in the art that a filtration and/or pumping system may be needed for the reuse process, and that replenishment of HCl or the HCl-generating component may be needed, e.g., by the method described hereinabove.

A still further aspect relates to methods of manufacturing an article comprising a microelectronic device, said method comprising contacting the microelectronic device with a composition described herein for sufficient time to clean bulk and hardened resist from the microelectronic device having said resist thereon, and incorporating said microelectronic device into said article, using a composition described herein.

Another aspect relates to a method of removing resist from a microelectronic device surface having same thereon, said method comprising:

contacting a composition to the microelectronic device surface for a first time at a first temperature necessary to at least partially remove resist from the microelectronic device surface; and increasing the temperature of the composition to a second temperature to remove residual resist from the microelectronic device surface, wherein the second temperature is greater than the first temperature.

Yet another aspect relates to a method of removing ion-implanted resist from the surface of a microelectronic device comprising same, said method comprising:

contacting the microelectronic device with a composition of the first or second aspect for time and temperature necessary to effectuate at least partial removal of the resist, wherein the composition comprises at least one non-oxidizing acid and at least one fluoride and/or bromide compound, with the proviso that the composition is substantially devoid of oxidizers;

rinsing the microelectronic device with DMSO to effectuate the removal of resist residues and the composition; and rinsing the microelectronic device with isopropanol to effectuate the removal of DMSO from the device.

Still another aspect relates to a method of removing ion-implanted resist from the surface of a microelectronic device comprising same, said method comprising:

contacting the microelectronic device with a composition of the first or second aspect at a first temperature for a first time necessary to effectuate at least partial removal of the resist from the surface, wherein the composition comprises at least one non-oxidizing acid and at least one fluoride and/or bromide compound, with the proviso that the composition is substantially devoid of oxidizers;

raising the temperature of the composition to a second temperature and continuing to contact the microelectronic device for a second time to effectuate the substantial removal of the resist from the surface, wherein the second temperature is greater than the first temperature;

rinsing the microelectronic device with DMSO to effectuate the removal of resist residues and the composition; and rinsing the microelectronic device with isopropanol to effectuate the removal of DMSO from the device.

Yet another aspect relates to a method of removing ion-implanted resist from the surface of a microelectronic device comprising same, said method comprising:

combining a sulfur-containing acid and either HCl (hydrogen chloride) added as dissolved gas or an HCl-generating compound for time necessary to generate a composition comprising at least the sulfur-containing acid and HCl;

contacting the microelectronic device with the composition for time and temperature necessary to effectuate at least partial removal of the resist;

rinsing the microelectronic device with a first rinse comprising water, DMSO or methanol to effectuate the removal of resist residues and the composition; and optionally rinsing the microelectronic device with isopropanol to effectuate the removal of the first rinse from the device.

The features and advantages of the invention are more fully shown by the illustrative examples discussed below.

EXAMPLE 1

The following formulations were prepared and were used in a process described herein to remove bulk and hardened resist from a coupon.

| Formulation | Fluoride species | MSA (99%) |
| --- | --- | --- |
| A | 2.56 wt % hexafluorotitanic acid | 97.44 wt % |
| B | 5.21 wt % tetrabutylammonium tetrafluoroborate | 94.79 wt % |
| C | 6.20 wt % tetrabutylammonium trifluoromethanesulfonate | 93.80 wt % |
| D | 0.90 wt % ammonium bifluoride | 99.10 wt % |
| E | 2.67 wt % tetramethylammonium fluoride tetrahydate (98%) | 97.33 wt % |
| F | 0.59 wt % ammonium fluoride | 99.41 wt % |
| G | 2.90 wt % fluoboric acid (48%) | 97.10 wt % |
| H | 0.66 wt % HF (0.66%) | 99.34 wt % |
| I | 0.33 HF (0.66%) | 99.67 wt % |
| J | 0.11 HF (0.66%) | 99.89 wt % |

The implant resist stripping process included immersing a coupon in each Formulation A-J for 10 minutes at room temperature, followed by a DMSO rinse, followed by an isopropanol rinse, followed by a $N_2$ dry. The etch rate measurements of blanketed wafers included measuring the initial thickness of the $SiO_2$ (100 nm thermal oxide on Si) and PECVD SiN (400 nm PECVD $SiN_2$ on Si) coupons, immersing a coupon in 40 $cm^3$ of Formulation A-J for 20 minutes at 20° C., followed by an overflow rinse for 1 min, followed by rinsing in the stream for approximately 10 sec, followed by a $N_2$ dry, and lastly a measurement of the final thickness of $SiO_2$ and PECVD SiN. Initial and post treatment thickness was measured using spectroscopic ellipsometry. The results are shown in Table 1.

TABLE 1

| Formulation | $SiO_2$ etch rate/Å $min^{-1}$ | SiN etch rate/Å $min^{-1}$ |
| --- | --- | --- |
| A | 6.304 | 8.501 |
| B | −0.12 | 0.971 |
| C | −0.25 | −0.117 |
| D | 7.995 | 9.489 |
| E | 2.439 | 5.14 |
| F | 0.597 | 3.94 |
| G | 0.693 | 2.239 |
| H | 0.580 | 4.135 |
| I | 0.110 | 2.286 |
| J | 0.021 | 1.113 |

It can be seen that lowering the HF concentration (formulations H-J) linearly reduces both SiN and $SiO_2$ etch rates. The formulations comprising the fluoride species tetrabutylammonium tetrafluoroborate, tetrabutylammonium trifluoromethanesulfonate, and fluoboric acid actually resulted in lower SiN and $SiO_2$ etch rates than HF.

With regards to the resist removal, referring to FIG. 1, it can be seen that the removal of resist was not dramatically dependent on which fluoride species chosen, with the exception of tetrabutylammonium tetrafluoroborate.

Notably, lowering the concentration of IF resulted in comparable resist removal with lower $SiO_2$ and SiN etch rates.

EXAMPLE 2

Figure 2A:
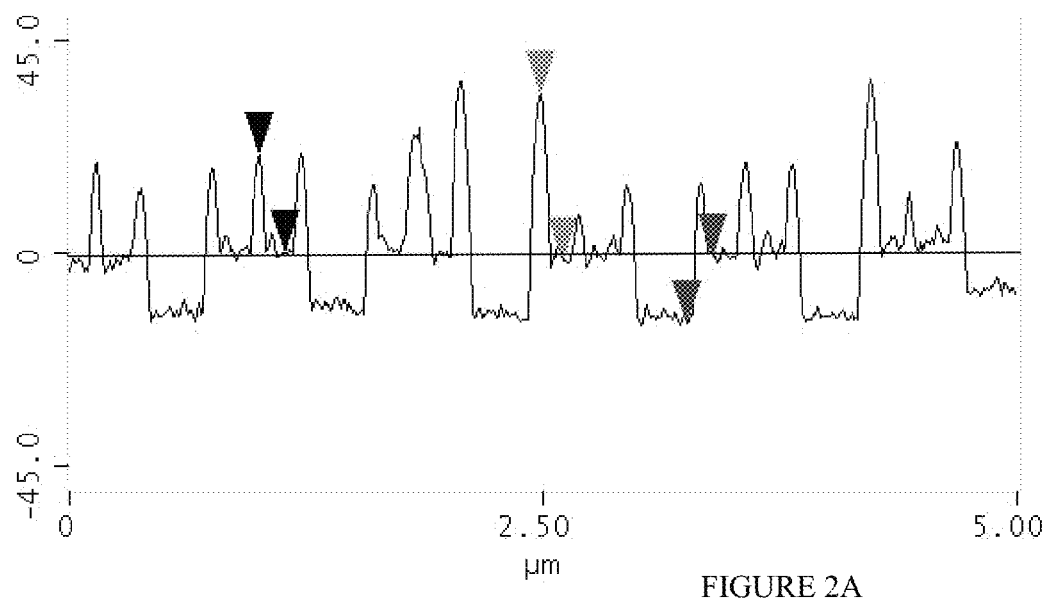
FIG. 2A and FIG. 2B illustrate a coupon following resist removal using DMSO for 10 min at 20° C.
Figure 2B:
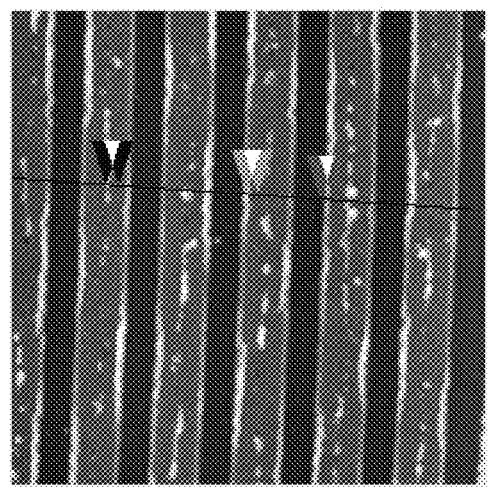

Additional studies were performed with formulation H. In a first experiment, a patterned wafer coupon having medium dose high energy implant on Ge was immersed without stirring in DMSO for 10 min at 20° C. The coupon was removed and rinsed with isopropanol. Referring to FIGS. 2A-2B, which shows the AFM scan in FIG. 2B and the cross-sectional analysis in FIG. 2A it can be seen that most of the crust and all of the "rails" are still present.

Figure 3A:
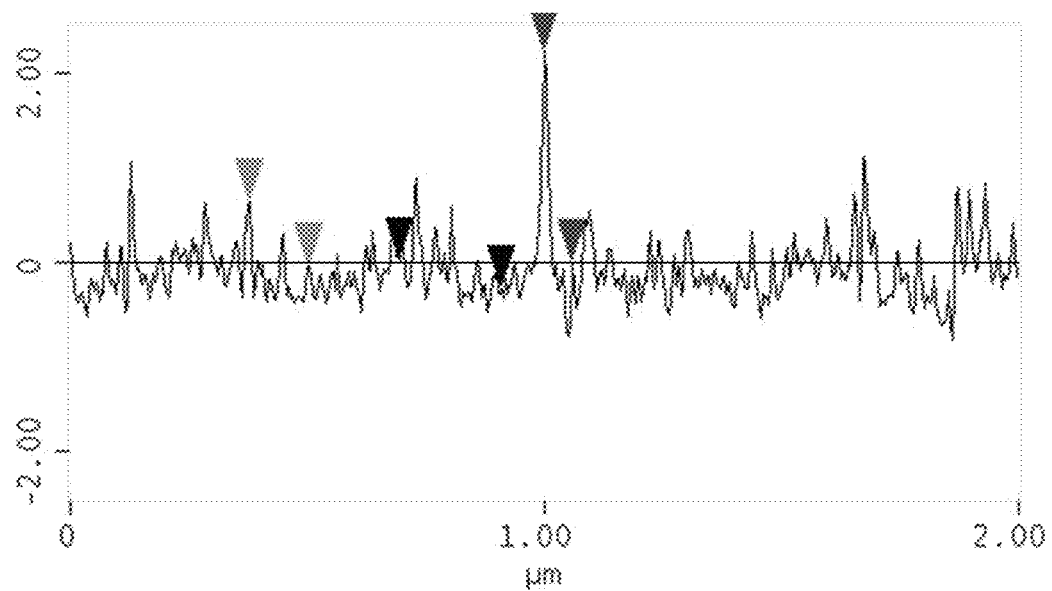
FIG. 3A and FIG. 3B illustrate a coupon following resist removal using formulation H for 10 min at 20° C.
Figure 3B:
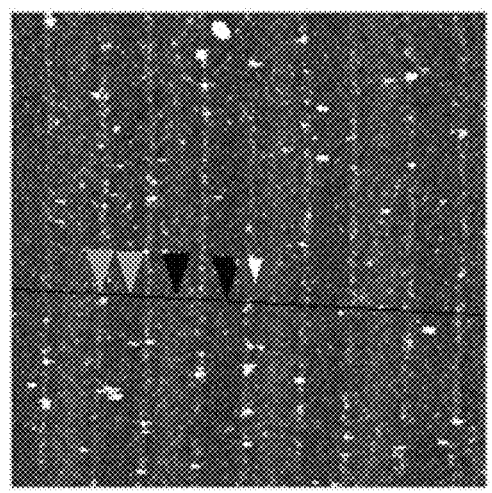

In a second experiment, a patterned wafer coupon having medium dose high energy implant on Ge was immersed without stirring in formulation H for 10 min at 20° C. The coupon was removed and rinsed with DMSO followed by a second rinse with isopropanol. Referring to FIGS. 3A-3B, which shows the AFM scan in FIG. 3B and the cross-sectional analysis in FIG. 3A it can be seen that a small amount of the "rails" are still present. Although not wishing to be bound by theory, it is thought that the debris is re-deposited crust and rail particles.

Figure 4A:
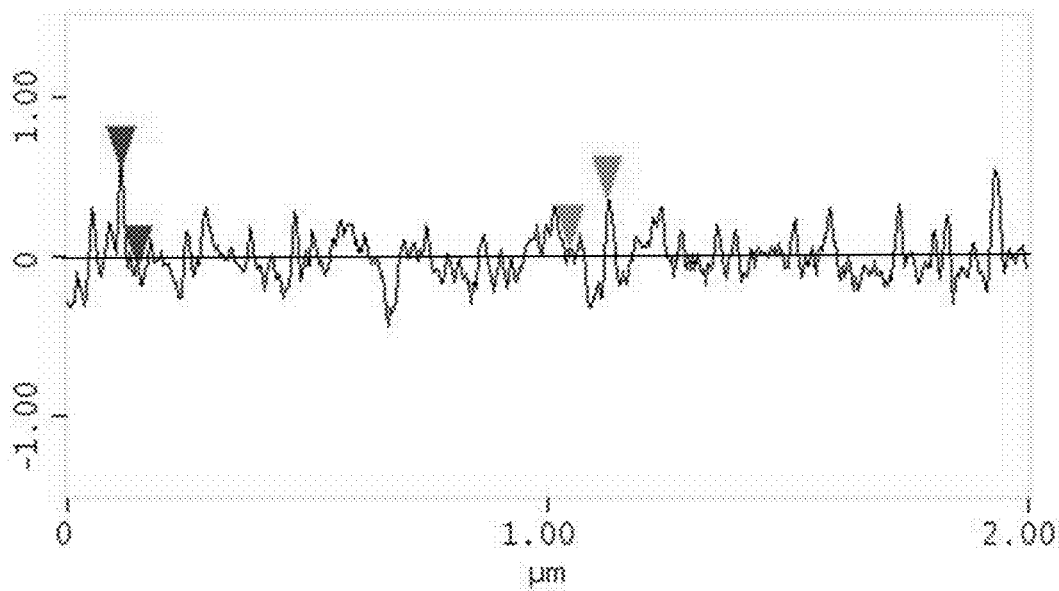
FIG. 4A and FIG. 4B illustrate a coupon following resist removal using formulation H for 10 min at 60° C.
Figure 4B:
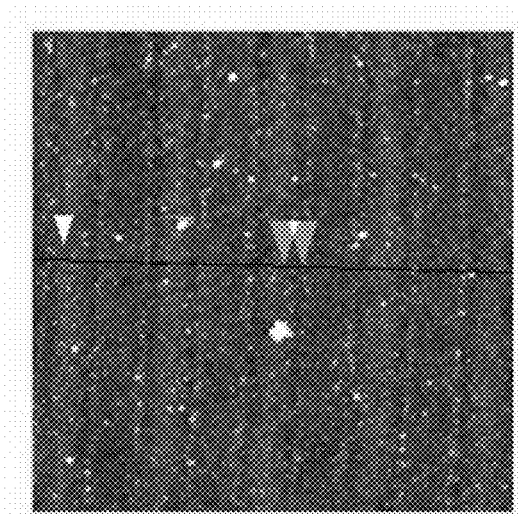

In a third experiment, a patterned wafer coupon having medium dose high energy implant on Ge was immersed without stirring in formulation H for 10 min at 60° C. The coupon was removed and rinsed with DMSO followed by a second rinse with isopropanol. Referring to FIGS. 4A-4B, which shows the AFM scan in FIG. 4B and the cross-sectional analysis in FIG. 4A it can be seen that the resist and crust has been substantially removed.

Figure 5:
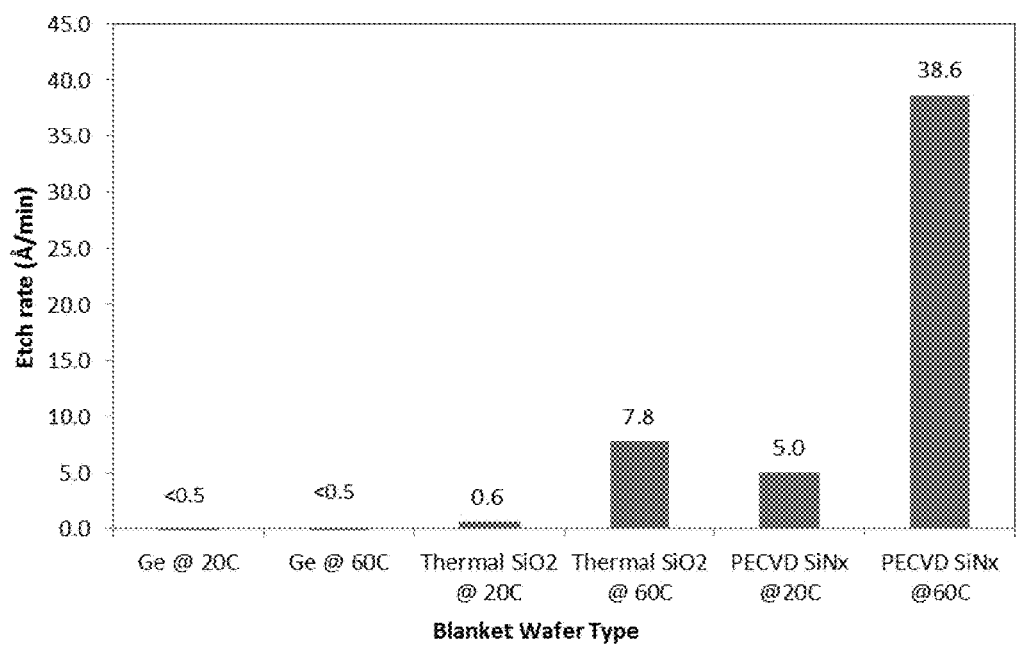
FIG. 5 illustrates the etch rates of SiO2, SiNx and Ge following immersion of same in formulation H at 25° C. and 60° C.

The etch rates of blanketed wafers were determined by immersing $SiO_2$ (100 nm thermal oxide on Si), PECVD SiN (400 nm PECVD $SiN_x$ on Si), and Ge (120 nm Ge on Si) coupons in formulation H without stirring at 25° C. and 60° C. Referring to FIG. 5, it can be seen that the etch rate of the silicon-containing layers was dependent on the temperature while the etch rate of the Go was less than 0.5 Å $min^{-1}$ regardless of the temperature.

Even with the HF present, the etch rates for Ge and $SiO_2$ in formulation H are modest, especially at room temperature. The resist removal can be nearly complete at room temperature, although higher temperature (e.g., 60° C.) helps.

EXAMPLE 3

Figure 6A:
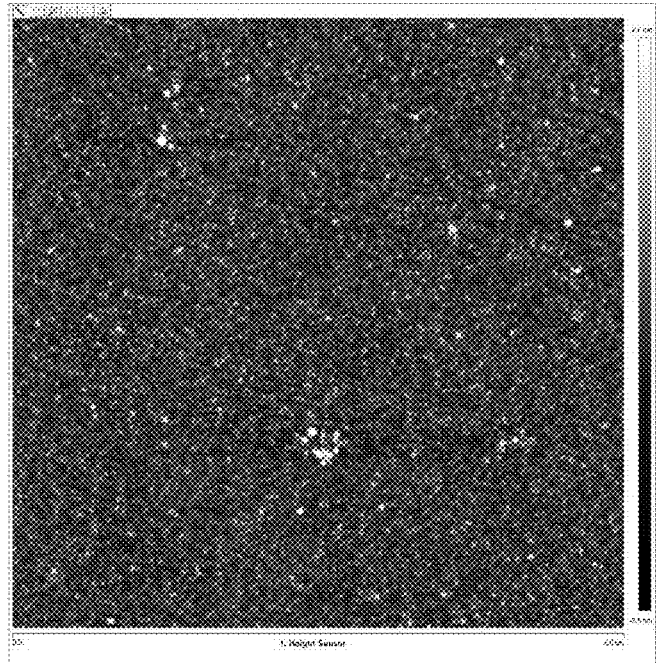
FIG. 6A and FIG. 6B include AFM micrographs at site 1 (FIG. 6A) and site 2 (FIG. 6B) following immersion in formulation N for 10 minutes at room temperature.
Figure 6B:
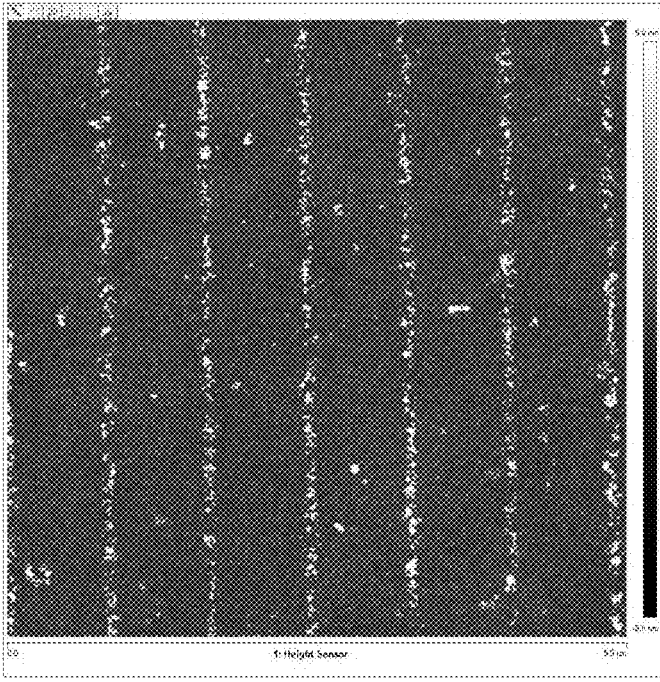
Figure 7A:
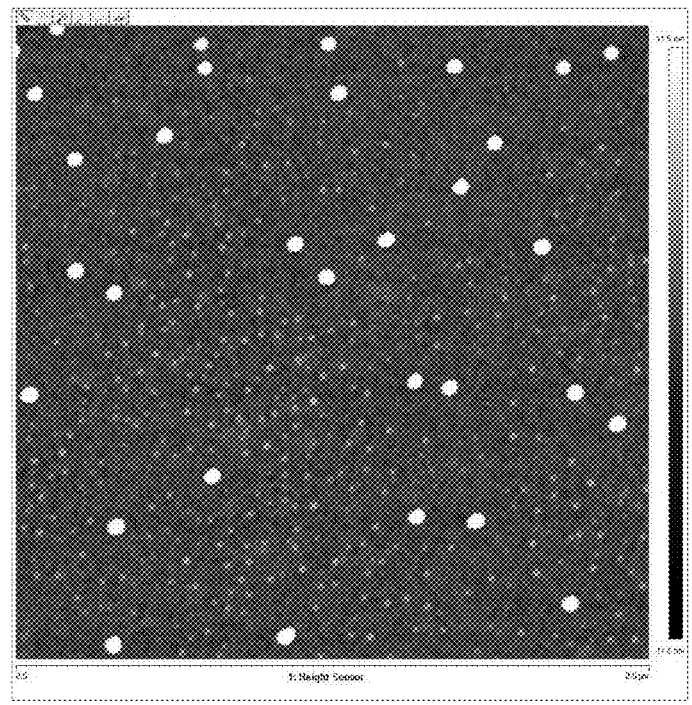
FIG. 7A and FIG. 7B include AFM micrographs at site 1 (FIG. 7A) and site 2 (FIG. 7B) following immersion in formulation U for 10 minutes at room temperature.
Figure 7B:
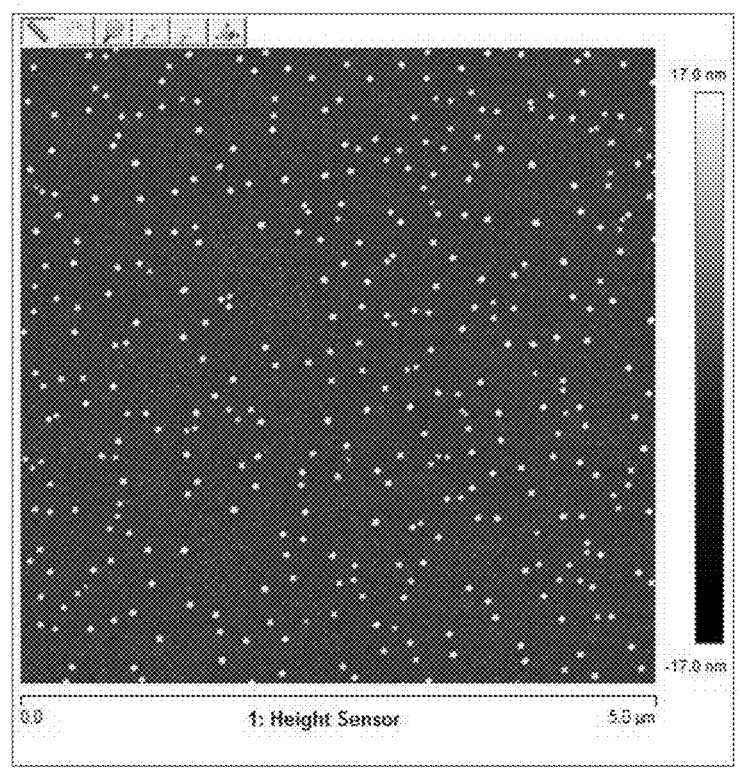

Solutions K-U were prepared as indicated in Table 2. Germanium coupons were pre-measured using ellipsometry and treated with 18 hr old solutions K-U for 10 minutes at room temperature. The coupons were rinsed with DMSO for 60 sec, then with isopropanol for 30 sec, then dried with nitrogen gas. The coupons were measured again to determine Ge loss and $GeO_2$ loss Referring to FIGS. 6 and 7, which are AFM micrographs of germanium coupons immersed in formulations N and U, respectively, it can be seen that formulation N removed the rails completely from site 1 and mostly removed them from site 2. Formulation U removed the rails from both sites.

EXAMPLE 4

A composition AA was prepared by combining 95 wt % conc. $H_2SO_4$ (96%) and 5 wt % $SOCl_2$. The composition was used 24 hours after blending. The implant resist stripping process included immersing a coupon in the AA composition for 2 minutes at room temperature, followed by a 60 sec DMSO rinse, followed by a 30 see isopropanol rinse and nitrogen blow dry.

Figure 8:
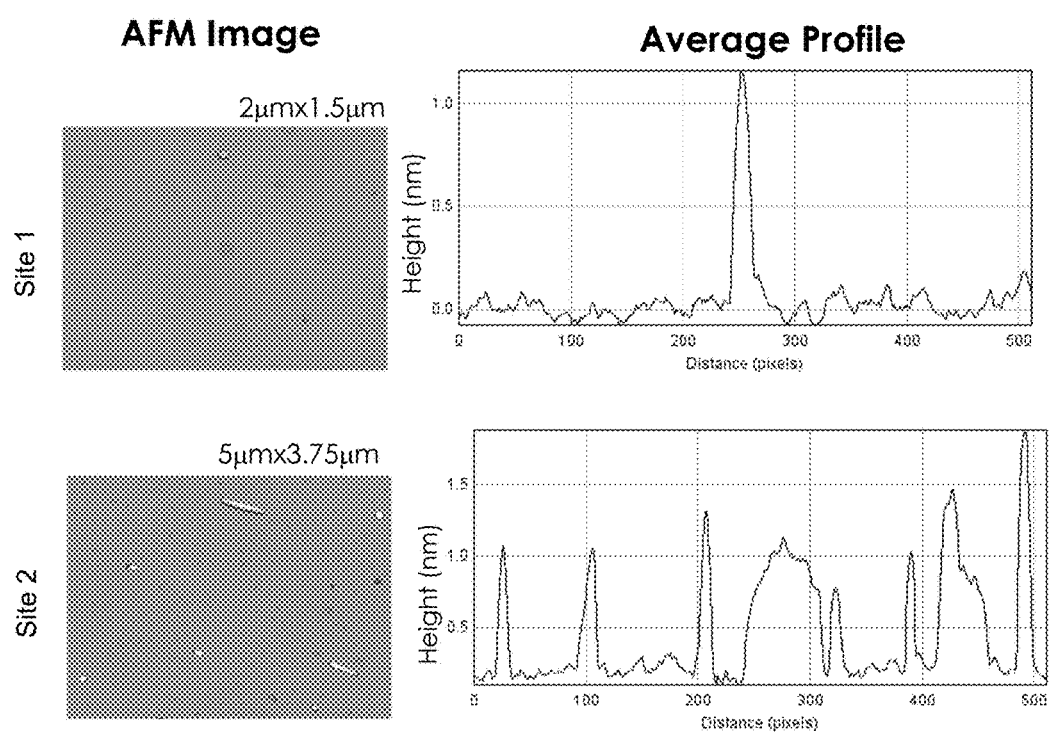
FIG. 8 includes AFM micrographs at site 1 and site 2 along with the average profile following immersion in formulation AA for 2 minutes at room temperature.

Following the rinse, the coupons were imaged using atomic force microscopy (AFM) at two sites patterned as groups of parallel lines 250 and 500 nm wide, heretofore respectively Site 1 and Site 2. The images resulting from "horizontal" (parallel to x-axis) scans are shown in FIG. 8, along with the average profile obtained by averaging all horizontal scans as a function of x-axis displacement (to facilitate measurement of rails and other remaining systematic resist features). No rails were observed; the highest particles were 53 nm high.

EXAMPLE 5

The implant resist stripping process of Example 5 included immersing a coupon in the AA composition for 10 minutes at room temperature, followed by a 60 sec DMSO rinse, followed by a 30 see isopropanol rinse and nitrogen blow dry.

Figure 9:
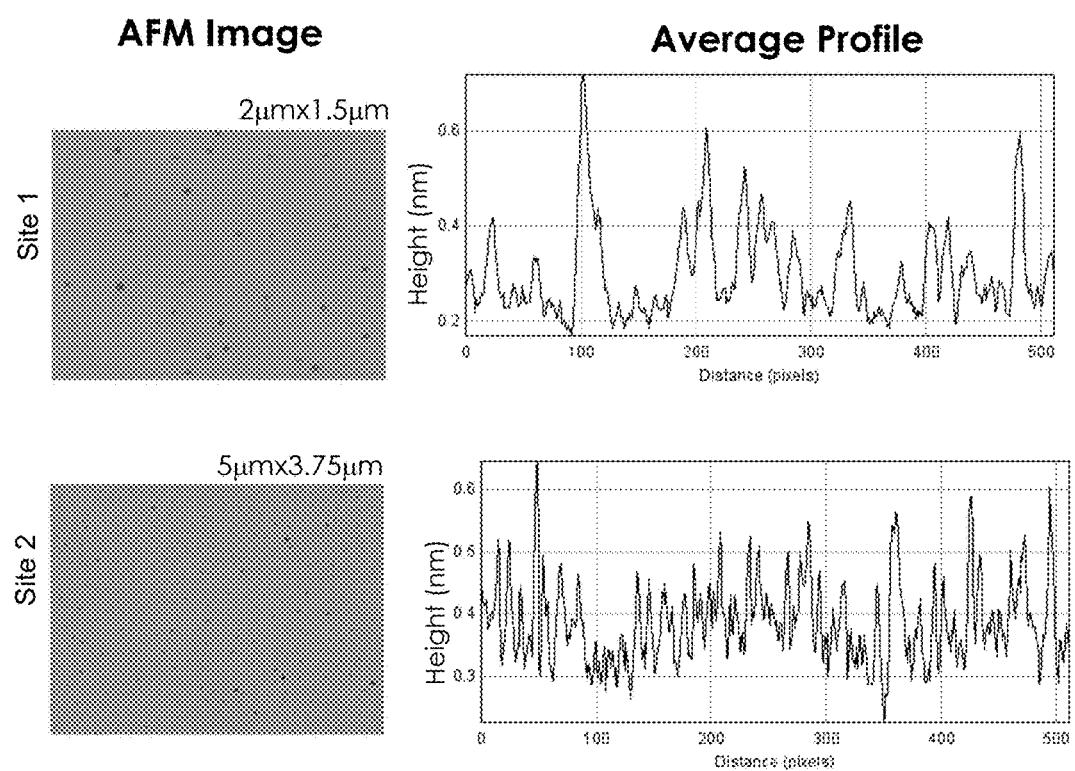
FIG. 9 includes AFM micrographs at site 1 and site 2 along with the average profile following immersion in formulation AA for 10 minutes at room temperature.

Following the rinse, the coupons were imaged using atomic force microscopy (AFM) at Site 1 and Site 2. The images are shown in FIG. 9, along with the average profile. It can be seen that no rails were observed; the highest particles were less than 20 nm high. Notably, it was observed that freshly blended solutions (used 100 min and especially 10 min after blending) did not remove the resist as well as aged solutions, leaving much higher rails.

EXAMPLE 6

A composition BB was prepared by combining 98.9 wt % conc. $H_2SO_4$ (96%), 1 wt % $SOCl_2$, and 0.1 wt % DTAC. The composition was used 68 hours after blending. The implant resist stripping process included immersing a coupon in the BB composition for 2.5 minutes at room temperature, followed by a 60 sec DMSO rinse, followed by a 30 sec isopropanol rinse and nitrogen blow dry.

| Formulation | MSA (99 + %)/wt % | conc. $H_2SO_4$/wt % | MSM | conc. HF/wt % | Ge loss/Å | $GeO_2$ loss/A |
|---|---|---|---|---|---|---|
| K | 99.8 | 0 | 0 | 0.2 | 3.7 ± 1.3 | 14.0 ± 0.4 |
| L | 89.8 | 10 | 0 | 0.2 | 1.4 ± 0.7 | 12.9 ± 0.4 |
| M | 89.8 | 0 | 10 | 0.2 | 2.9 ± 0.7 | 14.1 ± 0.2 |
| N | 79.8 | 10 | 10 | 0.2 | 5.9 ± 1.5 | 13.3 ± 0.1 |
| O | 0 | 59.8 | 40 | 0.2 | −4.9 ± 1.9 | 13.4 ± 0.2 |
| P | 94.8 | 5 | 0 | 0.2 | 5.5 ± 1.3 | 12.9 ± 0.3 |
| Q | 79.8 | 20 | 0 | 0.2 | 4.5 ± 0.4 | −1.9 ± 3.4 |
| R | 59.8 | 40 | 0 | 0.2 | 1.2 ± 0.5 | 11.8 ± 0.1 |
| S | 29.8 | 70 | 0 | 0.2 | 4.6 ± 0.7 | 11.9 ± 0.2 |
| T | 9.8 | 90 | 0 | 0.2 | −1.7 ± 1.9 | 11.9 ± 0.1 |
| U | 0 | 99.8 | 0 | 0.2 | −0.7 ± 1.8 | 12.2 ± 0.4 |

Figure 10:
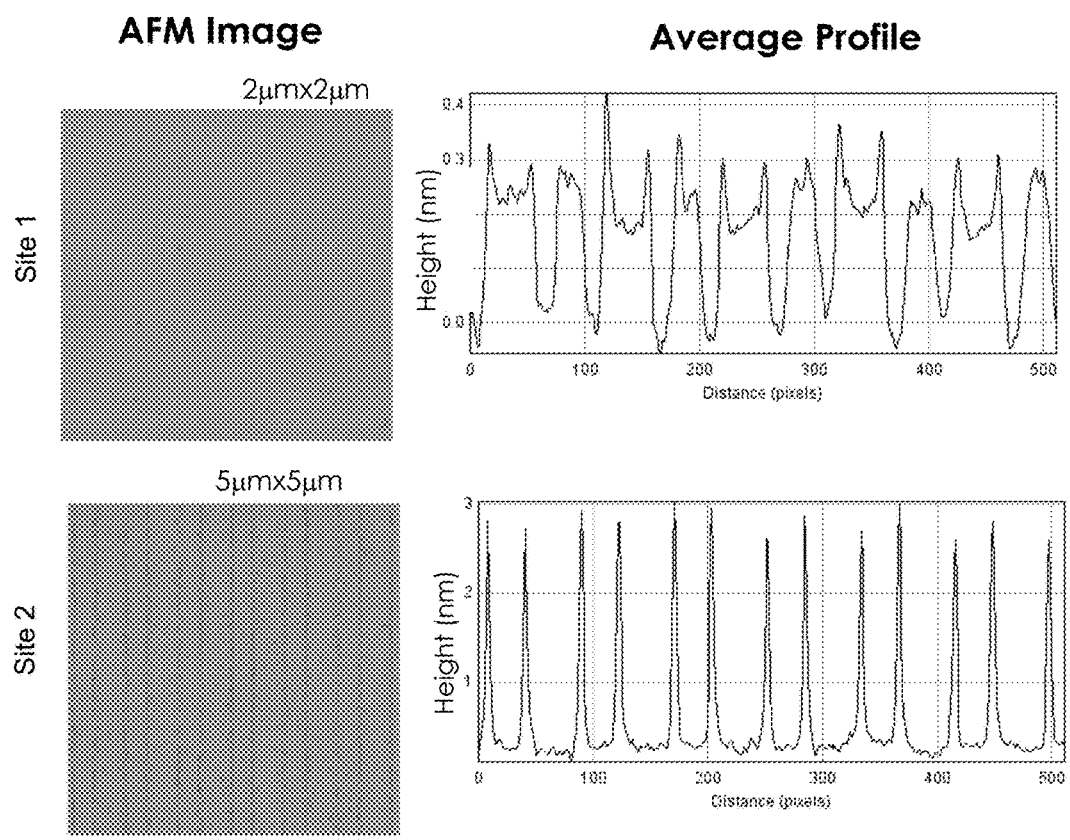
FIG. 10 includes AFM micrographs at site 1 and site 2 along with the average profile following immersion in formulation BB for 2.5 minutes at room temperature.

Following the rinse, the coupons were imaged using atomic force microscopy (AFM) at Site 1 and Site 2. The images are show in FIG. 10, along with the average profile. It can be seen that the lower SOCl$_2$ content seemed to leave higher "rails," but the presence of the DTAC helped reduce the presence of particles.

EXAMPLE 7

A composition CC was prepared by combining 95 wt % H$_2$SO$_4$ (100%, slightly fuming) and 5 wt % SOCl$_2$. The composition was used 4 days after blending. The implant resist stripping process included immersing a coupon in the CC composition for 2.5 minutes at mom temperature, followed by a 60 sec DMSO rinse, followed by a 30 see isopropanol rinse and nitrogen blow dry.

Figure 11:
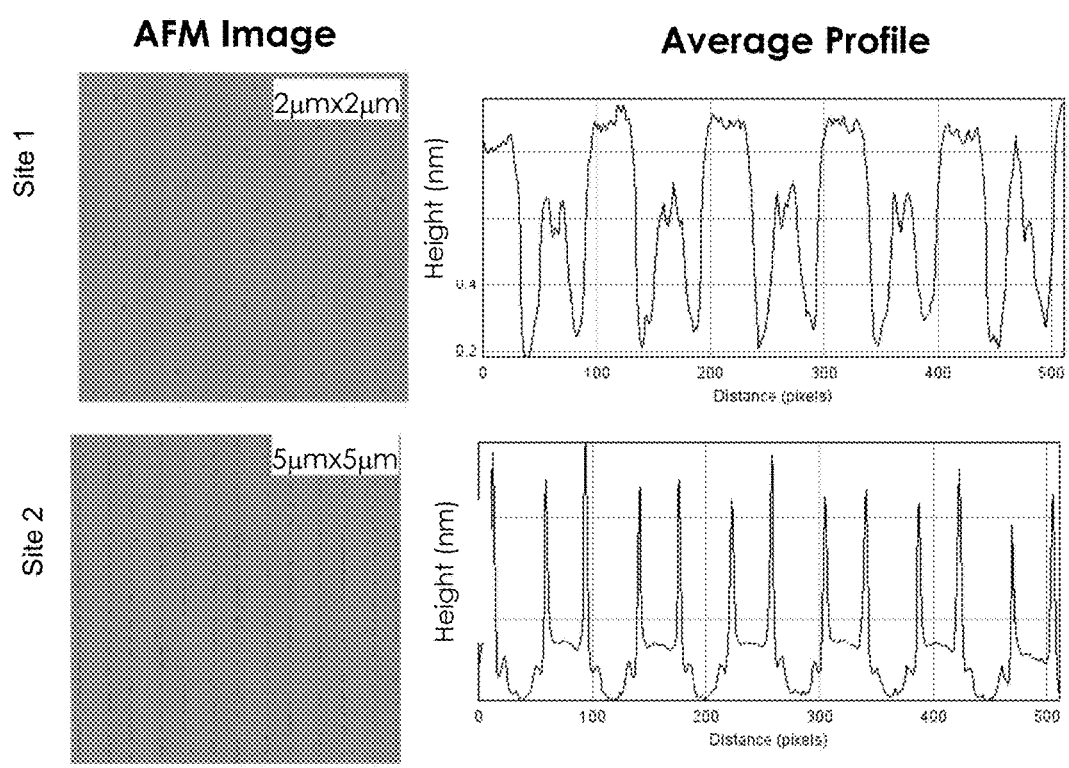
FIG. 11 includes AFM micrographs at site 1 and site 2 along with the average profile following immersion in formulation CC for 2.5 minutes at room temperature.

Following the rinse, the coupons were imaged using atomic force microscopy (AFM) at Site 1 and Site 2. The images are shown in FIG. 11, along with the average profile.

EXAMPLE 8

A composition DD was prepared by combining 94.9 wt % conc. H$_2$SO$_4$ (100%, slightly fuming), 5 wt % SOCl$_2$, and 0.1 wt % DTAC. The composition was used 4 days after blending. The implant resist stripping process included immersing a coupon in the DD composition for 2.5 minutes at room temperature, followed by a 60 see DMSO rinse, followed by a 30 sec isopropanol rinse and nitrogen blow dry.

Figure 12:
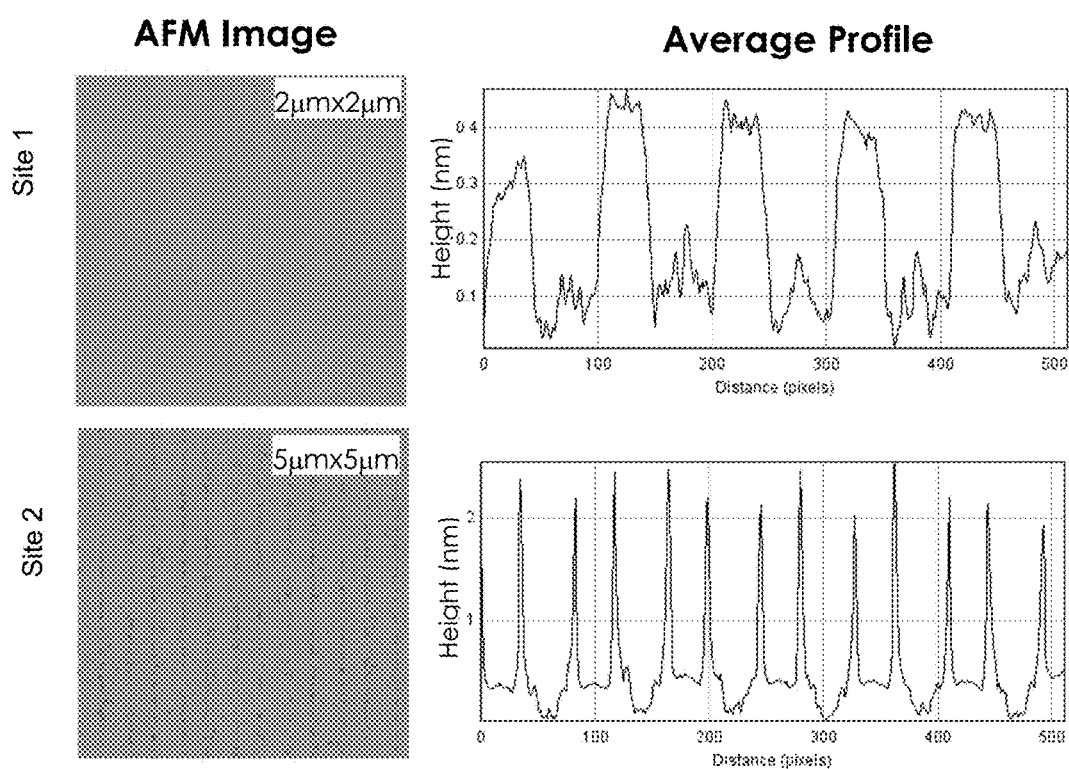
FIG. 12 includes AFM micrographs at site 1 and site 2 along with the average profile following immersion in formulation DD for 2.5 minutes at room temperature.

Following the rinse, the coupons were imaged using atomic force microscopy (AFM) at Site 1 and Site 2. The images are shown in FIG. 12, along with the average profile. Comparing the results from Example 5 with the results from Example 4, it can be seen that site 1 may have benefited from the presence of die surfactant.

EXAMPLE 9

A composition EE was prepared by combining 98.9 wt % conc. H$_2$SO$_4$, (96%), 1 wt % SOCl$_2$, and 0.1 wt % DTAC. The composition was used 21 days after blending. The implant resist stripping process included immersing a coupon in the EE composition for 1 minute at room temperature, followed by a 30 sec water rinse, a blow dry, and a second 1 minute immersion with the EE composition at room temperature, followed by a 30 sec water rinse, a 30 sec isopropanol rinse, and nitrogen blow dry.

Figure 13:
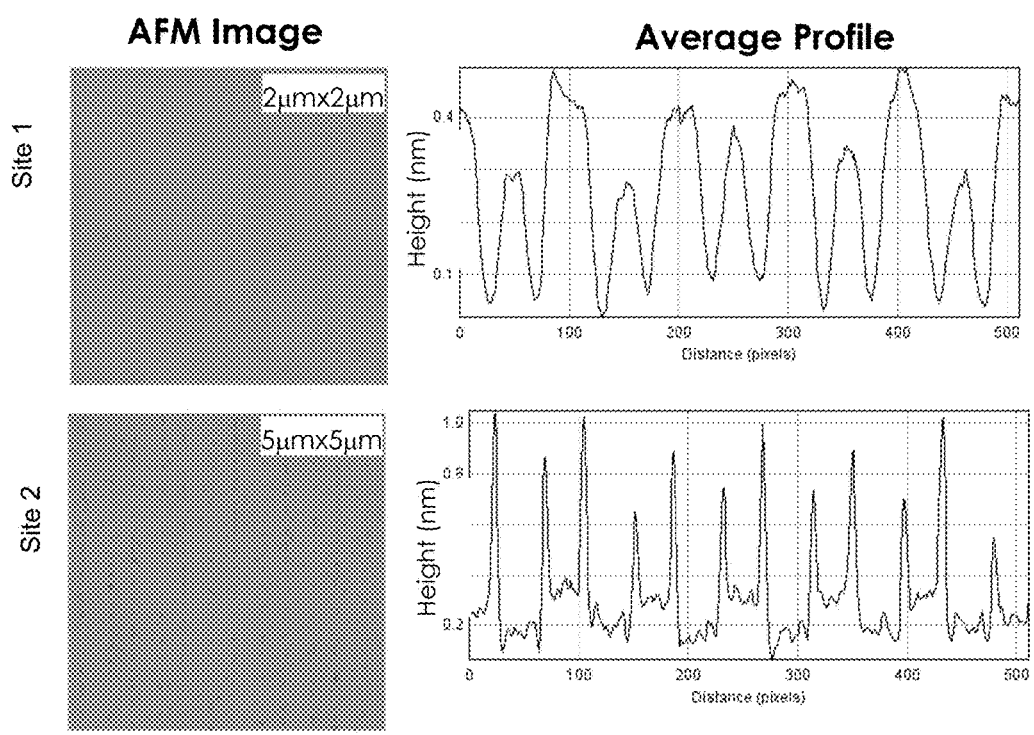
FIG. 13 includes AFM micrographs at site 1 and site 2 along with the average profile following immersion in formulation EE for 1 minute at room temperature, followed by a 30 sec water rinse, a blow dry, and a second 1 minute immersion with the composition at room temperature.

Following the rinse, the coupons were imaged using atomic force microscopy (AFM) at Site 1 and Site 2. The images are shown in FIG. 13, along with the average profile.

Although the invention has been variously disclosed herein with reference to illustrative embodiments and features, it will be appreciated that the embodiments and features described hereinabove are not intended to limit the invention, and that other variations, modifications and other embodiments will suggest themselves to those of ordinary skill in the art, based on the disclosure herein. The invention therefore is to be broadly construed, as encompassing all such variations, modifications and alternative embodiments within the spirit and scope of the claims hereafter set forth.

What is claimed is:

1. A composition comprising:
(a) at least one non-oxidizing acid present in an amount greater than 80 wt %, at least one of a fluoride species and/or a bromide compound, and at least one compound that lowers the melting point of the composition, with the proviso that the composition is substantially devoid of oxidizers, and wherein the pH of the composition is less than 2, wherein the at least one fluoride species comprises hydrofluoric acid in an amount of from about 0.01 wt% to about 1 wt % or a species in an amount of from about 0.01 wt % to about 8 wt % selected from the group consisting of hydrofluoric acid, tetrafluoroboric acid, hexafluorotitanic acid, hexafluorosilicic acid, hexafluorozirconic acid, tetrafluoboric acid, tetrabutylammonium trifluoromethanesulfonate, tetraalkylammonium tetrafluoroborates (NR1R2R3R4BF4) tetraalkylammonium hexafluorophosphates (NR1R2R3R4PF6), tetraalkylammonium fluorides (NR1R2R3R4F), ammonium bifluoride, ammonium fluoride, and combinations thereof, where R1, R2, R3, R4 may be the same as or different from one another and is selected from the group consisting of hydrogen, straight-chained or branched C1-C6 alkyl groups, C1-C6 alkoxy groups, and substituted or unsubstituted aryl groups, and combinations thereof;
(b) a sulfur-containing acid present in an amount greater than 90 wt %, HCl, and optionally at least one fluoride and/or at least one bromide compound; or
(c) a sulfur-containing acid present in an amount greater than 90% and an HCl-generating compound,
wherein when in contact with a surface of a microelectronic device, the composition removes ion-implanted resist material from the surface of the microelectronic device while not substantially damaging silicon- containing materials and germanium-containing materials present on the surface of the microelectronic device.

2. The composition of claim 1, wherein the at least one non-oxidizing acid comprises a species selected from the group consisting of methanesulfonic acid, oxalic acid, citric acid, tartaric acid, picolinic acid, succinic acid, acetic acid, lactic acid, sulfosuccinic acid, benzoic acid, propionic acid, formic acid, pyruvic acid, oxalic acid, maleic acid, malonic acid, fumaric acid, malic acid, ascorbic acid, mandelic acid, heptanoic acid, butyric acid, valeric acid, glutaric acid, phthalic acid, hypophosphorous acid, salicylic acid, 5-sulfosalicylic acid, ethanesulfone acid, butanesulfonic acid, p-toluenesulfonic acid, dichloroacetic acid, difluoroacetic acid, monochloroacetic acid, monofluoroacetic acid, hydrochloric acid, trichloroacetic acid, trifluoroacetic acid, hydrobromic acid, sulfuric acid, and combinations thereof.

3. The composition of claim 1, wherein the HCl-generating compound comprises a species selected from the group consisting of thionyl chloride (SOCl2), phosphoryl trichloride (POCl3), sulfuryl chloride (SO2Cl2), boron trichloride (BCl3), germanium tetrachloride (GeCl4), chlorosulfonic acid, (ClSO3H), and combinations thereof.

4. The composition of claim 1, comprising at least one bromide species, wherein the atleast one bromide species comprises hydrobromic acid.

5. The composition of claim 1, wherein the at least one compound that lowers the melting point of the composition comprises at least one dialkyl sulfone, sulfuric acid, or sulfolane.

6. The composition of claim 5, wherein the at least one dialkyl sulfone comprises a species selected from the group consisting of dimethylsulfone, ethyl methyl sulfone, dipropyl sulfone, ethyl propyl sulfone, diethyl sulfone, dibutyl sulfone, and combinations thereof.

7. The composition of claim 1, wherein the sulfur-containing acid comprises a species selected from the group consisting of concentrated sulfuric acid, 100% sulfuric acid, "fuming" sulfuric acid (containing excess SO$_3$), chlorosulfonic acid (ClSO₃H), mixtures of chlorosulfonic acid and sulfuric acid, trifluoromethanesulfonic acid (CF₃SO₃H) and fluorosulfonicacid (FSO₃H).

8. The composition of claim 1, wherein the composition (b) is substantially devoid of oxidizers.

9. The composition of claim 1, wherein the composition (a) is substantially devoid of added water.

10. The composition of claim 1, wherein the composition (b) is substantially devoid of added water.

* * * * *